US008877530B2

(12) United States Patent
Seong

(10) Patent No.: US 8,877,530 B2
(45) Date of Patent: Nov. 4, 2014

(54) SUPPORTING SUBSTRATE FOR PREPARING SEMICONDUCTOR LIGHT-EMITTING DEVICE AND SEMICONDUCTOR LIGHT-EMITTING DEVICE USING SUPPORTING SUBSTRATES

(71) Applicant: LG Innotek Co., Ltd., Seoul (KR)

(72) Inventor: Tae Yeon Seong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/024,129

(22) Filed: Sep. 11, 2013

(65) Prior Publication Data

US 2014/0065746 A1 Mar. 6, 2014

Related U.S. Application Data

(62) Division of application No. 12/995,998, filed as application No. PCT/KR2009/002938 on Jun. 2, 2009, now abandoned.

(30) Foreign Application Priority Data

Jun. 2, 2008 (KR) .......................... 10-2008-0051396
Jun. 2, 2008 (KR) .......................... 10-2008-0051397
Jul. 15, 2008 (KR) .......................... 10-2008-0068521
Jul. 15, 2008 (KR) .......................... 10-2008-0068525

(51) Int. Cl.
| H01L 33/64 | (2010.01) |
| H01L 33/00 | (2010.01) |
| H01L 33/48 | (2010.01) |
| H01L 33/44 | (2010.01) |

(52) U.S. Cl.
CPC ........... *H01L 33/005* (2013.01); *H01L 33/0095* (2013.01); *H01L 33/48* (2013.01); *H01L 33/0079* (2013.01); *H01L 33/641* (2013.01); *H01L 33/44* (2013.01)
USPC .............................................. 438/33; 438/46

(58) Field of Classification Search
CPC . H01L 33/48; H01L 33/0079; H01L 33/0095; H01L 33/641; H01L 33/44
USPC ....................................... 257/99; 438/33, 122
See application file for complete search history.

(56) References Cited

U.S. PATENT DOCUMENTS

| 2004/0058476 A1 | 3/2004 | Enquist et al. |
| 2004/0137655 A1* | 7/2004 | Chikuma et al. ................ 438/22 |

(Continued)

FOREIGN PATENT DOCUMENTS

| CN | 1790682 | 6/2006 |
| EP | 1 385 215 A2 | 1/2004 |

(Continued)

OTHER PUBLICATIONS

Korean Office Action dated Jul. 23, 2012.

(Continued)

*Primary Examiner* — Olik Chaudhuri
*Assistant Examiner* — Christine Enad
(74) *Attorney, Agent, or Firm* — KED & Associates, LLP

(57) ABSTRACT

A method may be provided for preparing a semiconductor light-emitting device. The method may include: preparing a first wafer in which a semiconductor multi-layered light-emitting structure is disposed on an upper part of an initial substrate; preparing a second wafer which is a supporting substrate; bonding the second wafer on an upper part of the first wafer; separating the initial substrate of the first wafer from a result of the bonding; and fabricating a single-chip by severing a result of the passivation. Other embodiments may be provided.

19 Claims, 16 Drawing Sheets

(56) References Cited

U.S. PATENT DOCUMENTS

| | | | |
|---|---|---|---|
| 2004/0160021 A1* | 8/2004 | Tatsumi et al. | 279/128 |
| 2005/0205875 A1 | 9/2005 | Shei et al. | 257/79 |
| 2005/0208691 A1* | 9/2005 | Shei et al. | 438/29 |
| 2006/0060877 A1 | 3/2006 | Edmond et al. | 257/99 |
| 2006/0097354 A1* | 5/2006 | Ogihara et al. | 257/613 |
| 2007/0029683 A1* | 2/2007 | Tsai et al. | 257/796 |
| 2007/0111473 A1* | 5/2007 | Furukawa et al. | 438/455 |
| 2007/0221944 A1 | 9/2007 | Cheol Yoo | 257/99 |
| 2007/0281438 A1 | 12/2007 | Liu et al. | |
| 2008/0224154 A1* | 9/2008 | Jiang et al. | 257/88 |
| 2008/0258133 A1 | 10/2008 | Seong | |
| 2008/0265265 A1 | 10/2008 | Xiong et al. | |
| 2009/0072263 A1 | 3/2009 | Paolini et al. | |
| 2011/0003416 A1 | 1/2011 | Jang et al. | |
| 2011/0081738 A1 | 4/2011 | Ogihara et al. | |

FOREIGN PATENT DOCUMENTS

| | | |
|---|---|---|
| EP | 2 259 346 A2 | 12/2010 |
| EP | 2 280 426 A2 | 2/2011 |
| JP | 2002-76523 | 3/2002 |
| JP | 2005-056957 | 3/2005 |
| JP | 2005-109208 | 4/2005 |
| JP | 2005-277372 | 10/2005 |
| JP | 2005-347714 | 12/2005 |
| JP | 2006-086361 | 3/2006 |
| JP | 2006-140186 | 6/2006 |
| JP | 2006-303034 | 11/2006 |
| JP | 2006-324685 | 11/2006 |
| JP | 2006-332681 | 12/2006 |
| JP | 2007-13046 | 1/2007 |
| JP | 2008-042143 | 2/2008 |
| JP | 2008-098336 | 4/2008 |
| KR | 10-2004-0104232 | 12/2004 |
| KR | 10-2005-0013989 | 5/2005 |
| KR | 10-2006-0093225 | 8/2006 |
| KR | 10-2006-0093528 | 8/2006 |
| KR | 10-0638869 | 10/2006 |
| KR | 10-0886110 B1 | 2/2009 |
| KR | 10-0916366 B1 | 9/2009 |
| WO | WO 03/009504 | 1/2003 |
| WO | WO 2004/109764 | 12/2004 |
| WO | WO 2007/049939 | 5/2007 |

OTHER PUBLICATIONS

Japanese Office Action dated Sep. 28, 2012.
Chinese Officen Action dated Mar. 5, 2013 for Application 200980130052.8 and English language translation.
U.S. Office Action for U.S. Appl. No. 12/995,998 dated Feb. 6, 2012.
U.S. Office Action for U.S. Appl. No. 12/995,998 dated Jun. 20, 2012.
U.S. Office Action for U.S. Appl. No. 12/995,998 dated Jan. 3, 2013.
U.S. Office Action for U.S. Appl. No. 12/995,998 dated Jun. 12, 2013.
International Search Report and Written Opinion mailed Jan. 25, 2010, issued in corresponding international application PCT/KR2009/002938, filed Jun. 2, 2009, 6 pages.
Japanese Office Action for Application 2013-011303 dated Jan. 7, 2014.
European Search Report issued in application No. 09758506.1 dated Sep. 5, 2014.

* cited by examiner (a)    (a)

(a)　　　　　　　　　(a)

US 8,877,530 B2

SUPPORTING SUBSTRATE FOR PREPARING SEMICONDUCTOR LIGHT-EMITTING DEVICE AND SEMICONDUCTOR LIGHT-EMITTING DEVICE USING SUPPORTING SUBSTRATES

This application is a Divisional application of U.S. application Ser. No. 12/995,998 having a 371 filing date of Feb. 9, 2011 (and filed on Dec. 2, 2010), and which is a U.S. National Stage application of International Application PCT/KR2009/002938, filed Jun. 2, 2009, which claims priority to Korean Patent Application Nos. 10-2008-0068525, 10-2008-0068521, filed on Jul. 15, 2008 and Korean Patent Application Nos. 10-2008-0051397 and 10-2008-0051396 filed on Jun. 2, 2008, which are all hereby incorporated by reference in their entirety.

TECHNICAL FIELD

The present invention relates to a supporting substrate for preparing a semiconductor light-emitting device using a multi-layered light-emitting structure thin film and a method for preparing a semiconductor light-emitting device using the supporting substrate for preparing a semiconductor light-emitting device.

More particularly, in a Group III-V nitride-based semiconductor light-emitting device vertically structured in the up and down ohmic contact electrode structure, it relates to a semiconductor light-emitting device which minimizes damage to a semiconductor single crystal multi-layered light-emitting structure thin film, thereby improving the overall performance, by bonding a multi-layered light-emitting structure thin film formed on an initial substrate (e.g., $Al_2O_3$, SiC, Si, GaAs, GaP) to grow the Group III-V nitride-based semiconductor and a supporting substrate for preparing a semiconductor light-emitting device through wafer bonding and then separating/removing the multi-layered light-emitting structure thin film from the initial substrate through the laser lift off, chemo-mechanical polishing, or wet-etching process.

BACKGROUND

Generally, a semiconductor light-emitting device has a light-emitting diode (LED) and a laser diode (LD) generating light when a forward current flows. Particularly, the LED and LD have a common p-n junction, and when a current is applied to the light-emitting device, the current is converted to photons and thereby light is emitted from the device. The light emitted from the LED and LD has various wavelengths from a long wavelength to a short wavelength depending on the semiconductor material(s). Above all, LEDs made from wide band-gap semiconductors allow red, green and blue colors in visible bands and have been applied widely in industries such as displays for electronic devices, traffic lights, and various light sources for display devices. Due to the development of white light in recent years, it will be widely used as the next generation light source for general lighting.

A Group III-V nitride-based semiconductor is generally grown hetero-epitaxially on the upper part of sapphire, silicon carbide (SiC), or silicon (Si) which is an initial substrate having a significantly different lattice constant and thermal expansion coefficient to obtain high quality semiconductor thin films. However, since the sapphire initial substrate has poor thermal conductivity, it cannot apply a large current to LEDs. Since the sapphire initial substrate is an electrical insulator and thereby is difficult to respond to static electricity flowed in from outside, it has a high possibility to cause failure due to the static electricity. Such drawbacks not only reduce reliability of devices but also cause a lot of constraints in packaging processes.

Further, the sapphire initial substrate, which is an insulator, has a MESA structure in which both an n-type ohmic contact electrode (hereinafter referred as to "first ohmic contact electrode") and a p-type ohmic contact electrode (hereinafter referred as to "second ohmic contact electrode") are formed in the same growth direction as that of a multi-layered light-emitting structure. Since an LED chip area should be higher than a certain size, there is limit to reducing the LED chip area, restricting the improvement of LED chip production.

In addition to these disadvantages of the MESA-structured LEDs grown on the upper part of the sapphire substrate as an initial substrate, it is difficult to release a great amount of heat outward generated inevitably during the operation of the light-emitting device since the sapphire substrate has poor thermal conductivity. Due to these reasons, there is a limitation in applying the MESA structure, to which the sapphire substrate is attached, to light-emitting devices used for a large area and a large capacity (that is, a large current) such as the light for large displays and general lighting. When a high current is applied to a light-emitting device for a long period of time, the internal temperature of a light-emitting active layer is gradually increased largely due to the generated heat and thereby an LED light-emitting efficiency is gradually decreased.

A silicon carbide (SiC) substrate, unlike the sapphire substrate, not only has good thermal and electric conductivity but also allows a multi-layered light-emitting structure thin film to be laminated and grown since it has a similar lattice constant and thermal expansion coefficient (TEC), which are important factors in the semiconductor single crystal thin film growth, as that of Group III-V nitride-based semiconductors. Further, it allows the manufacturing of various types of vertical-structured light-emitting devices. However, because producing a high quality SiC substrate is not easy, it is more expensive than producing other single crystal substrates, making it difficult for mass production.

Therefore, it is most desirable to provide a high-performance light-emitting device by using a multi-layered light-emitting structure laminated and grown on a sapphire substrate in view of the technology, economy and performance. As described above, much effort has been made to produce a high-performance vertical structured LED by growing a high quality multi-layered light-emitting structure thin-film on the upper part of a sapphire initial substrate, lifting-off the Group III-V nitride-based semiconductor multi-layered light-emitting structure thin film from the sapphire substrate and using the result, in order to resolve the problems associated with the MESA-structured LEDs produced by using a thin film which is Group III-V nitride-based semiconductor multi-layered light-emitting structure laminated/grown on the upper part of a sapphire substrate which is an initial substrate.

FIG. 1 is a sectional view illustrating a process for separating a sapphire initial substrate by employing a conventional laser lift off (LLO) process. As shown in FIG. 1, when a laser beam, which is a strong energy source, is irradiated to the backside of a transparent sapphire initial substrate 100, the laser beam is absorbed strongly at the interface and the temperature of 900° C. or higher is thereby generated momentarily and causes thermochemical dissociation of gallium nitride (GaN) at the interface, and further separates the sapphire initial substrate 100 from the nitride-based semiconductor thin film 120. However, it has been reported in many documents that in the laser lift-off process of the Group III-V nitride-based semiconductor multi-layered light-emitting structure thin film, the semiconductor single crystal thin film is damaged and broken after being separated from the sapphire substrate due to a mechanical stress generated between the thick sapphire initial substrate and the Group III-V nitride-based semiconductor thin film because of the difference in the lattice constant and thermal expansion coefficient. When the Group III-V nitride-based semiconductor multi-layered light-emitting structure thin film is damaged and broken, it causes a large leaky current, reduces the chip yield of light-emitting devices and reduces the overall performance of the light-emitting devices. Therefore, studies are currently under way for manufacturing a high-performance vertical-structured LED by using the lift-off process of the sapphire substrate which can minimize damage to the Group III-V nitride-based semiconductor multi-layered light-emitting structure thin film and the separated semiconductor single crystal thin film.

Various methods have been suggested to minimize damage and breaking of the Group III-V nitride-based semiconductor multi-layered light-emitting structure thin film when the sapphire initial substrate is separated by the LLO process. FIG. 2 is sectional views illustrating a process for forming a stiffening supporting substrate in the growth direction by employing a wafer bonding, electro plating or electroless plating process prior to the LLO process according to a conventional technology to prevent damage and breaking of a semiconductor multi-layered light-emitting structure thin film. Referring to (a) in FIG. 2, a supporting substrate 240, which is strongly adhered and is structurally stable by using wafer bonding, is formed on the upper part of a bonding layer 230 before lifting off semiconductor single crystal multi-layered light-emitting structure thin films 210, 220 from an initial substrate 200 by irradiating the backside of the initial substrate made of transparent sapphire with a laser beam. Referring to (b) in FIG. 2, a supporting substrate 242, which is strongly adhered and is structurally stable, is formed on the upper part of a seed layer 232 by using an electro plating process before lifting off the semiconductor single crystal multi-layered light-emitting structure thin films 210, 220 from the initial substrate 200 made of sapphire.

FIG. 3 is a sectional view illustrating vertical-structured Group III-V nitride-based semiconductor light-emitting devices manufactured by introducing the supporting substrate, which is strongly adhered and is structurally stable, according to the conventional technology used in the process of FIG. 2.

The figure indicated by (a) in FIG. 3 is a sectional view illustrating a semiconductor light-emitting device manufactured by using the method for manufacturing the supporting substrate indicated by (a) in FIG. 2. Referring to (a) in FIG. 2 illustrating an LED section bonded with a wafer, it is successively constituted with a supporting substrate 340, which is a thermal and electrical conductor, a bonding layer 330, a multi-layered metal layer 350 including a second ohmic contact electrode, a second semiconductor cladding layer 380, a light-emitting active layer 370, a first semiconductor cladding layer 360, and a first ohmic contact electrode 390. A semiconductor wafer such as silicon (Si), germanium (Ge), silicon-germanium (SiGe), gallium arsenide (GaAs) and the like having an excellent electrical conductivity is preferably used as the electro conductive supporting substrate 340.

However, the supporting substrate 340, used for the vertical-structured light-emitting device (LED) as shown in (a) of FIG. 3, causes significant wafer warpage and fine micro-cracks inside the semiconductor multi-layered light-emitting structure when Si or another conductive supporting substrate wafer is bonded by wafer bonding because it has a significant difference in thermal expansion coefficient (TEC) against the sapphire substrate on which the semiconductor single crystal thin film is grown/laminated. Such problems further cause processing difficulties and lower the performance of LED manufactured therefrom and the product yield.

The figure indicated by (b) in FIG. 3 is a sectional view illustrating a semiconductor light-emitting device manufactured by using the method for manufacturing the supporting substrate indicated by (b) in FIG. Referring to (b) in FIG. 3 illustrating the sectional view of the LED formed through electro plating, the vertical-structured light-emitting device (LED) formed through an LLO and electro plating process is successively constituted with a supporting substrate 342, which is electrically conductive, a seed layer 332, a multi-layered metal layer 352 including a second ohmic contact electrode, a second semiconductor cladding layer 380, a light-emitting active layer 370, a first semiconductor cladding layer 360, and a first ohmic contact electrode 390. The electrically conductive supporting substrate 342, which is a metallic thick film formed through electro plating, is preferably formed with a single metal such as Cu, Ni, W, Au, Mo and the like or an alloy composed thereof.

The LED supporting substrate 342 having the structure described above as shown in (b) of FIG. 3 has a significantly higher thermal expansion coefficient and flexibility than the sapphire substrate due to the metal or alloy thick film formed through electro plating, thereby causing curling, warpage, breaking, etc.

Therefore, it is highly demanded that highly efficient supporting substrates and methods for manufacturing the high performance vertical-structured light-emitting devices using the same are develop to resolve the problems of wafer warpage, breaking, micro-crack, annealing and singulate chip processing, post-processing problems, low product yield, etc. while manufacturing the vertical-structured Group III-V nitride-based semiconductor light-emitting device using the LLO process.

DISCLOSURE

Technical Problem

The present invention provides a supporting substrate for preparing a semiconductor light-emitting device that does not cause wafer warpage when a sapphire substrate, on which a thin film having Group III-V nitride-based semiconductor multi-layered light-emitting structure is laminated and grown, is wafer-bonded with a supporting substrate by bonding materials or breakings and micro-cracks inside the thin film having a semiconductor multi-layered light-emitting structure after an LLO processing.

The present invention also provides a high performance vertical-structured Group III-V nitride-based semiconductor light-emitting device using the supporting substrate for preparing a semiconductor light-emitting device, manufactured by laminating/growing a multi-layered light-emitting structure thin film composed of Group III-V nitride-based semiconductor single crystal on an upper part of a sapphire initial substrate, and employing the LLO process to minimize damage and breaking of the semiconductor single crystal thin film.

The present invention also provides a method for manufacturing the high performance vertical-structured Group III-V nitride-based semiconductor light-emitting device.

Technical Solution

Contrived to solve the above technical problems, an aspect of the present invention features a supporting substrate for preparing a semiconductor light-emitting device, which can include: a selected supporting substrate formed of an electrical insulating material; a sacrificial layer formed by being laminated on an upper part of the selected supporting substrate; a heat-sink layer formed of a metal, an alloy or a solid solution having a high thermal and electric conductivity by being laminated on an upper part of the sacrificial layer; and a bonding layer formed by being laminated on an upper part of the heat-sink layer. The supporting substrate is used for a supporting substrate of a vertical-structured semiconductor light-emitting device.

The electrical insulating material of the selected supporting substrate can have a difference of thermal expansion coefficient of 2 ppm or less from an initial substrate. The electrical insulating material of the selected supporting substrate can be a single crystal, polycrystal or amorphous substance selected from the group consisting of sapphire ($Al_2O_3$), aluminum nitride (AlN), MgO, AlSiC, BN, BeO, $TiO_2$, $SiO_2$ and glass.

The sacrificial layer can be a single crystal, polycrystal or amorphous substance bonded with nitrogen or oxygen, and the substance can be at least one selected from the group consisting of GaN, InGaN, ZnO, InN, $In_2O_3$, ITO, $SnO_2$, $Si_3N_4$, $SiO_2$, BeMgO and MgZnO.

Further, if the sacrificial layer is separated from the selected supporting substrate by chemical etching, the sacrificial layer can be at least one material selected from the group consisting of metals, alloys, solid solutions, oxides, nitrides and thermophile organic materials.

Further, if the sacrificial layer is composed of a heat-resistant adhesive material, the sacrificial layer can be at least one material selected from the group consisting of heat-resistant adhesive, silicone adhesive and polyvinyl butyral resin.

Further, the sacrificial layer can be a silicate or a silicic acid material if the sacrificial layer is an SOG (Spin on Glass) thin film, and the sacrificial layer can be at least one selected from the group consisting of silicate, siloxane, methyl silsequioxane (MSQ), hydrogen silsequioxane (HSQ), MQS+HSQ, perhydrosilazane (TCPS) and polysilazane if the sacrificial layer is an SOD (Spin On Dielectrics).

Further, the sacrificial layer can be at least one selected from the group consisting of AZ series, SU-8 series, TLOR series, TDMR series, and GXR series if the sacrificial layer is composed of photoresist.

A composition material for the sacrificial layer can be appropriately selected according to characteristics of a selected supporting substrate, separation methods and vertical structures finally to be manufactured.

A thickness of the heat-sink layer can be 0.1 μm to 500 μm. The metal, alloy or solid solution forming the heat-sink layer can include at least one selected from the group consisting of Cu, Ni, Ag, Mo, Al, Au, Nb, W, Ti, Cr, Ta, Al, Pd, Pt and Si.

The bonding layer can be a soldering or brazing alloy material including at least one selected from the group consisting of Ga, Bi, In, Sn, Pb, Au, Al, Ag, Cu, Ni, Pd, Si and Ge.

The sacrificial layer, the heat-sink layer and the bonding layer laminated/formed on the upper part of the selected supporting substrate can be formed by physical vapor deposition, chemical vapor deposition or electrochemical deposition, and the sacrificial layer can be formed by one method selected from the group consisting of E-beam evaporator, thermal evaporator, MOCVD (Metal Organic Chemical Vapor Deposition), sputtering and PLD (Pulsed Laser Deposition), and the heat-sink layer can be formed by electro plating or electroless plating.

At least one of the sacrificial layer, the heat-sink layer and the bonding layer of the supporting substrate for preparing a semiconductor light-emitting device can be selectively patterned in the form of a predetermined shape, or all of the sacrificial layer, the heat-sink layer and the bonding layer of the supporting substrate for preparing a semiconductor light-emitting device can be patterned in the form of a predetermined shape, and the selected supporting substrate can be etched to a predetermined depth.

According to an embodiment, the sacrificial layer can be dissolved in a wet etching solution.

Another aspect of the present invention features a method for preparing a semiconductor light-emitting device that includes: (a) preparing a first wafer in which semiconductor multi-layered light-emitting structure is laminated/grown on an upper part of an initial substrate; (b) preparing a second wafer which is a supporting substrate for preparing a semiconductor light-emitting device; (c) bonding the second wafer on an upper part of the first wafer; (d) separating the initial substrate of the first wafer from a result of the bonding; (e) performing passivation after forming a first ohmic contact electrode on the upper part of the first wafer from which the initial substrate is separated; and (f) fabricating a single-chip by severing a result of the passivation, the supporting substrate for preparing a semiconductor light-emitting device of the second wafer can be formed by successively laminating the sacrificial layer, the heat-sink layer and the bonding layer on the selected supporting substrate.

Each layer of the semiconductor multi-layered light-emitting structure in the step (a) can be composed of a single crystal having composition of $In_x(Ga_yAl_{1-y})N(1=x=0, 1=y=0, x+y>0)$.

The wafer bonding of the step (c) can be performed by a thermo compression bonding method at the temperature of 100° C. to 600° C. and the pressure of 1 Mpa to 200 Mpa.

The separating of the initial substrate of the first wafer from the bonded result in the step (d) can be performed by a method selected from the group consisting of a laser lift-off method irradiating a laser beam to the surface of the initial substrate, a chemo-mechanical polishing method, and a wet etching method using a wet etching solution.

The preparing of the semiconductor light-emitting device in a single-chip of the step (f) can include: (f1) attaching a temporary supporting substrate formed of organic or inorganic bonding materials in the opposite direction of the supporting substrate for preparing a semiconductor light-emitting device; (f2) separating and removing the selected supporting substrate by thermochemical dissociation of the sacrificial layer with an electromagnetic light including a laser beam having an appropriate absorption wavelength range selected according to a material used for the sacrificial layer; and (f3) severing a result of the above steps in a vertical direction without any bonding process of the supporting substrate if the thickness of the heat-sink layer is greater than a predetermined value, and forming an additional bonding layer composed of an electrically conductive metal, solid solution or alloy and bonding a third supporting substrate to the heat-sink layer using the additional bonding layer and then severing a result of the forming and bonding in a vertical direction if the thickness of the heat-sink layer is smaller than a predetermined value.

The thickness of the heat-sink layer of the supporting substrate for preparing a semiconductor light-emitting device can be 80 μm to 500 μm.

The third supporting substrate can be formed of: a single crystal or polycrystal wafer including at least one component selected from the group consisting of Si, Ge, SiGe, ZnO, GaN, AlGaN and GaAs having thermal and electric conductivity; or a metal, alloy or solid solution foil including at least one selected from the group consisting of Mo, Cu, Ni, Nb, Ta, Ti, Au, Ag, Cr, NiCr, CuW, CuMo and NiW.

A material forming the first ohmic contact electrode in the step (e) can be composed of a material including at least one selected from the group consisting of Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare earth metals and alloys, metallic silicides, semiconducting silicides, CNTNs (carbonnanotube networks), transparent conducting oxides (TCO) and transparent conducting nitrides (TCN).

The first wafer in the step (a) can be prepared by forming an optical reflective layer, an electrical insulating layer, a diffusion barrier layer, a heat-sink layer, or a bonding layer on the upper part of the semiconductor multi-layered light-emitting structure laminated and grown on the upper part of the substrate.

The electrical insulating layer, the diffusion barrier layer, the heat-sink layer, or the bonding layer on the upper part of the semiconductor multi-layered light-emitting structure can be formed by physical vapor deposition, chemical vapor deposition, electro plating or electroless plating.

The sacrificial layer laminated on the selected supporting substrate of the second wafer can be composed of a material soluble in a wet etching solution, and the sacrificial layer of the supporting substrate for preparing a semiconductor light-emitting device in the step (f) can be wet-etched by dissolving the sacrificial layer into a wet etching solution to separate and remove the selected supporting substrate and then a single chip can be obtained by severing a result of the separating and removing.

The first ohmic contact electrode in the step (e) can be formed on an upper surface of a buffering layer or an n-type semiconductor cladding layer.

Advantageous Effect

As mentioned above, the present invention provides an easy method for manufacturing a vertical-structured light-emitting device by arranging the first and second ohmic contact electrodes on the upper part and the lower part of the Group III-V nitride-based semiconductor single crystal multi-layered light-emitting structure, respectively, to improve the production yield of LED chips and separating the sapphire substrate for efficient heat dissipation and prevention of static electricity. Further, the present invention minimizes micro-crack or breaking in the Group III-V nitride-based semiconductor and separates the Group III-V nitride-based semiconductor thin film into wafer bonding materials by performing wafer bonding not to have any wafer warpage in the supporting substrate for preparing a semiconductor light-emitting device before separating the sapphire substrate by using the laser lift-off process, thereby reducing the stress applied to the Group III-V nitride-based semiconductor layers during the separation of the sapphire substrate from the Group III-V nitride-based semiconductor multi-layered light-emitting structure by using the laser life-off process.

In addition, when the Group III-V nitride-based semiconductor multi-layered light-emitting structure is formed on the upper part of the supporting substrate for preparing a semiconductor light-emitting device, since any post-processing such as annealing, passivation, etc. can be performed in the present invention, it is possible to provide a highly reliable light-emitting device that causes no thermal or mechanical damage. In addition, when the high reliability light-emitting device formed on the upper part of the supporting substrate for preparing a semiconductor light-emitting device is performed for a unified chip process, the method of the present invention allows a high production yield and productivity that could not be achieved in the wafer bonding process with conventional supporting substrates, since wet etching can be used in the present invention rather than in the conventional mechanical and laser processes.

The supporting substrate for preparing a semiconductor light-emitting device allows not only the manufacturing of a high quality nitride-based semiconductor single crystal multi-layered thin film by employing wafer bonding but also any kind of post-processing after separating the sapphire substrate so that it is suitable for manufacturing high performance vertical-structured Group III-V nitride-based light-emitting devices.

Further, the present invention allows the manufacturing of a single-chip-type semiconductor light-emitting device by using a sacrificial layer formed on the supporting substrate for preparing a semiconductor light-emitting device without any mechanical processing such as sawing, laser scribing, etc. of the light-emitting device formed on the "supporting substrate for preparing a semiconductor light-emitting device" wafer of the present invention.

DESCRIPTION OF KEY ELEMENTS

Figure 1:
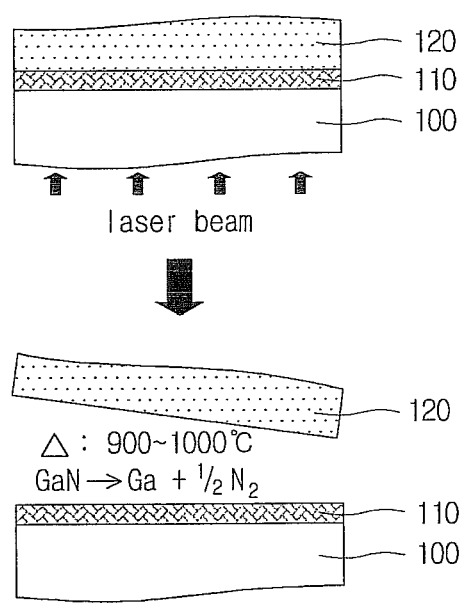
FIG. 1 is a sectional view illustrating a general laser lift-off (LLO) process in manufacturing a vertical-structured semiconductor light-emitting device according to a conventional technology.
Figure 2:
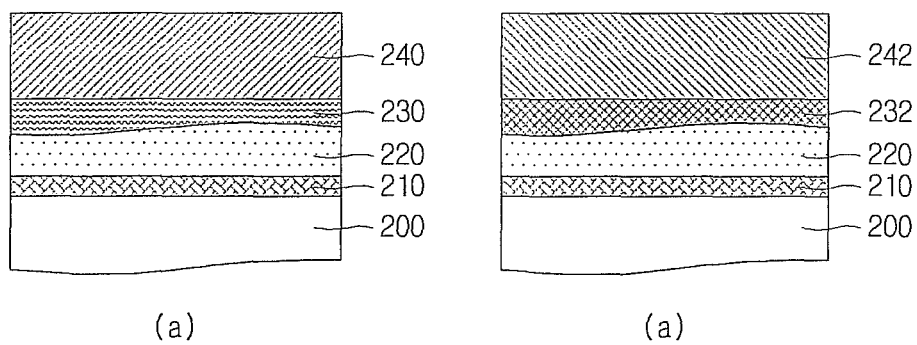
FIG. 2 is sectional views illustrating supporting substrates which are strongly adhered and are structurally stable in the growth direction of a Group III-V nitride-based semiconductor single crystal thin film before performing the laser lift off process according to a conventional technology.
Figure 3:
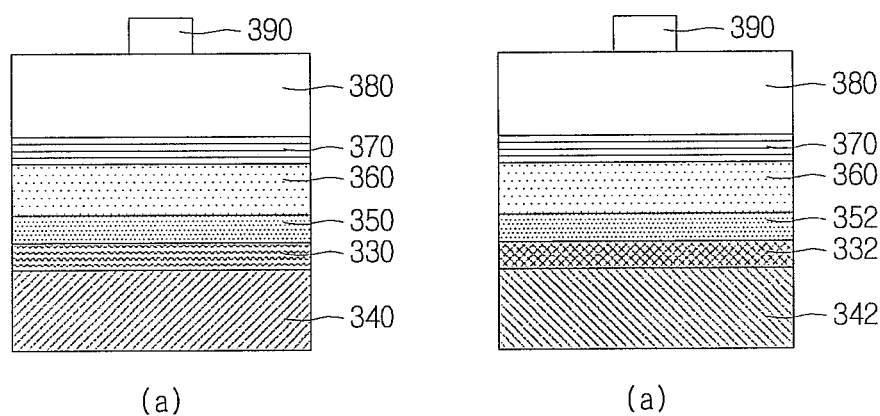
FIG. 3 is sectional views illustrating the LLO process and vertical-structured Group III-V nitride-based semiconductor light-emitting devices manufactured by bonding a supporting substrate which is strongly adhered and is structurally stable according to a conventional technology.

40: supporting substrate for preparing a semiconductor light-emitting device
50, 52, 54, 56, 58: supporting substrate for preparing a semiconductor light-emitting device
60: 62: 64: 66: 68: supporting substrate for preparing a semiconductor light-emitting device
70, 90, 1100, 1300, 1500: semiconductor light-emitting device
871, 1271, 1471: trench
881, 1281, 1481, 1681: supporting substrate for preparing a semiconductor light-emitting device

MODE FOR INVENTION

Hereinafter, a supporting substrate for preparing a semiconductor light-emitting device, a vertical-structured Group nitride-based semiconductor light-emitting device and a method for manufacturing thereof will be described in detail with reference to the accompanying drawings.

Example 1

Preparation of a Supporting Substrate for Preparing a Semiconductor Light-Emitting Device Preparation Example 1

Preparation of a Supporting Substrate for Preparing a Semiconductor Light-Emitting Device Hereinafter, the structure of a supporting substrate for preparing a semiconductor light-emitting device and its sequential manufacturing method according to an embodiment of the present invention will be described.

FIG. 4(a) is a sectional view illustrating a supporting substrate for preparing a semiconductor light-emitting device according to an embodiment of the invention.

Referring to FIG. 4(a), a supporting substrate for preparing a semiconductor light-emitting device 40 includes a selected supporting substrate 400, a sacrificial layer 410, a heat-sink layer 420, and a bonding layer 430.

A method for manufacturing the above-mentioned supporting substrate for preparing a semiconductor light-emitting device 40 includes: (a) preparing a selected supporting substrate; (b) forming a sacrificial layer; (c) forming a heat-sink layer; and (d) forming a bonding layer. As shown in FIG. 4(a), the supporting substrate for preparing the semiconductor light-emitting device 40 according to an embodiment of the present invention includes a tri-layer on the upper part of the selected supporting substrate 400. In other words, the sacrificial layer 410, the heat-sink layer 420 and the bonding layer 430 are successively formed on the upper part of the selected supporting substrate 400, which is an electrical non-conductor.

The structure of the supporting substrate for preparing a semiconductor light-emitting device and its manufacturing method will be described in detail below.

The selected supporting substrate 400 can have a difference of 2 ppm or less in thermal expansion coefficient from that of the substrate and be composed of single crystal, polycrystal, or amorphous substrate wafer such as sapphire ($Al_2O_3$), aluminum nitride (AlN), MgO, AlSiC, BN, BeO, $TiO_2$, $SiO_2$, glass and the like.

The selected supporting substrate 400 can absorb a mechanical impact of a laser beam and functions as a supporter for minimizing damage of a single crystal multi-layered light-emitting structure thin-film having the thickness of several μm while separating a Group III-V nitride-based semiconductor single crystal multi-layered light-emitting structure thin film from sapphire, which is an initial substrate, by using a strong energy source of laser beam.

In particular, the selected supporting substrate needs to be selected according to a method for manufacturing a vertical-structured light-emitting device to be manufactured. In other words, wafer bonding is performed to bond the supporting substrate for preparing a semiconductor light-emitting device with a first wafer before performing an LLO process. Here, wafer warpage may be often caused due to thermal property (e.g., thermal expansion coefficient) of the bonded wafer after the wafer bonding. It shall be apparent that the selected supporting substrate is a single crystal, polycrystal, or amorphous substrate wafer such as sapphire ($Al_2O_3$), aluminum nitride (AlN), MgO, AlSiC, BN, BeO, $TiO_2$, $SiO_2$, glass and the like having 2 ppm or less of thermal expansion coefficient, compared to sapphire which is an initial substrate.

The sacrificial layer 410 is a material layer necessary for the separation and removal of the selected supporting substrate 400 from a final light-emitting device using a laser beam which is a strong energy source. The material of the sacrificial layer 410 can be a single crystal, polycrystal, or amorphous material bonded with nitrogen or oxygen including GaN, InGaN, ZnO, InN, $In_2O_3$, ITO, $SnO_2$, $Si_3N_4$, $SiO_2$, BeMgO, MgZnO and the like. It can also be a Si single crystal, polycrystal, or amorphous material.

It is required that the sacrificial layer 410 be selected according to the characteristics of the selected supporting substrate and the structure of a vertical-structured light-emitting device to be manufactured.

The heat-sink layer 420 releases a great amount of heat outward generated during the operation of the manufactured vertical-structured light-emitting device and functions to form a tight bond between the upper and lower layers and as a supporter. Therefore, the heat-sink layer 420 can be composed of a metal, alloy or solid solution having excellent thermal and electric conductivity and formed by CVD or PVD, preferably by electro plating or electroless plating.

The bonding layer 430 is a material layer to bond the first wafer, which is the sapphire substrate on which the Group III-V nitride-based semiconductor single crystal multi-layered thin film is laminated/grown, and the supporting substrate for preparing a semiconductor light-emitting device and is composed of an alloy of soldering or brazing including at least one selected from the group consisting of Ga, Bi, In, Sn, Pb, Au, Al, Ag, Cu, Ni, Pd, Si, Ge.

Figure 4:
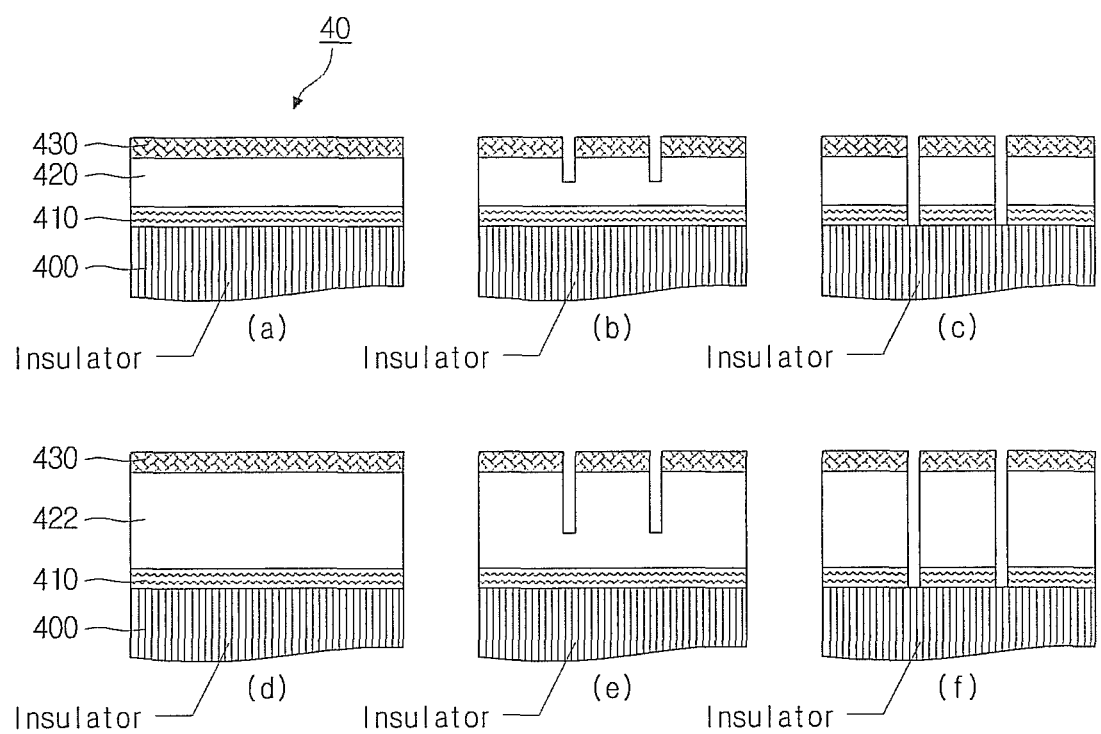
FIG. 4 shows sectional views illustrating examples of various modes of supporting substrates for preparing semiconductor light-emitting devices according to an embodiment of the present invention.

The sectional views shown in FIG. 4 illustrate examples of various modes of supporting substrates for preparing semiconductor light-emitting devices according to an embodiment of the present invention. FIGS. 4(a) and (d) are sectional views illustrating examples of supporting substrates for preparing a semiconductor light-emitting device which are not patterned, while FIGS. 4(b), (c), (e) and (f) are sectional views illustrating examples of supporting substrates for preparing a semiconductor light-emitting device which are patterned. FIG. 4(b) illustrates the supporting substrate for preparing a semiconductor light-emitting device in which the bonding layer and the heat-sink layer are patterned, and FIG. 4(c) illustrates the supporting substrate for preparing a semiconductor light-emitting device in which the bonding layer, the heat-sink layer and the sacrificial layer are patterned. FIG. 4(d) illustrates the supporting substrate for preparing a semiconductor light-emitting device in which the heat-sink layer 422 has a certain thickness, and FIGS. (e) and (f) illustrate patterned modes of supporting substrates for preparing a semiconductor light-emitting device having the thick heat-sink layer.

As shown in FIGS. (b), (c), (e), and (f), the supporting substrate for preparing a semiconductor light-emitting device according to an embodiment of the present invention allows an easy removal process of the selected supporting substrate 400 by patterning the bonding layer and the heat-sink layer, or the heat-sink layer and the sacrificial layer.

Preparation Example 2

Preparation of a Supporting Substrate for Preparing a Semiconductor Light-Emitting Device Hereinafter, the structure of a supporting substrate for preparing a semiconductor light-emitting device and its sequential manufacturing method according to an embodiment of the present invention will be described with reference to FIG. 5.

FIG. 5(a) is a sectional view illustrating a supporting substrate for preparing a semiconductor light-emitting device according to an embodiment of the present invention.

Referring to FIG. 5(a), a supporting substrate for preparing a semiconductor light-emitting device 50 includes a selected supporting substrate 500, a sacrificial layer 510, a heat-sink layer 520, and a bonding layer 530. A method for manufacturing the above mentioned supporting substrate for preparing a semiconductor light-emitting device 50 includes: (a) preparing a selected supporting substrate; (b) forming a sacrificial layer; (c) forming a heat-sink layer; and (d) forming a bonding layer. As shown in FIG. 5(a), the supporting substrate for preparing a semiconductor light-emitting device 50 according to an embodiment of the present invention includes a tri-layer on the upper part of the selected supporting substrate 500. In other words, the sacrificial layer 510, the heat-sink layer 520 and the bonding layer 530 are successively formed on the upper part of the selected supporting substrate 500 which is an electrical conductor.

The selected supporting substrate 500 has an excellent thermal and electric conductivity. The selected supporting substrate 500 can be a single crystal or polycrystal wafer chosen from Si, Ge, SiGe, ZnO, GaN, AlGaN, GaAs and the like, or a metal foil chosen from Mo, Cu, Ni, Nb, Ta, Ti, Au, Ag, Cr, NiCr, CuW, CuMo, NiW and the like.

The sacrificial layer 510 is composed of a material easily soluble in a wet etching solution and functions to separate a multi-layered light-emitting structure thin film of a light-emitting device from the selected supporting substrate 500 or to strongly bond a multi-layered light-emitting structure thin film of a light-emitting device and the selected supporting substrate 500 according to structure of a vertical-structured semiconductor light-emitting device finally to be manufactured.

The heat-sink layer 520 releases a great amount of heat outward generated during the operation of the manufactured vertical-structured light-emitting device and functions to form a tight bond between the upper and lower layers and as a supporter. Therefore, the heat-sink layer 520 can be composed of a metal, alloy or solid solution having an excellent thermal conductivity, include at least one chosen from Cu, Ni, Ag, Mo, Al, Au, Nb, W, Ti, Cr, Ta, Al, Pd, Pt, and Si, and be 0.1 μm to 500 μm thick as shown in FIGS. 5(a) and (b).

Supporting substrates for preparing a semiconductor light-emitting device 50, 52 have the heat-sink layer 520 having a thin thickness of 80 μm or less formed on the upper part of the selected supporting substrate 500 having an excellent thermal and electric conductivity.

In the supporting substrates for preparing a semiconductor light-emitting device 50, 52, wafer bonding with a first wafer, an LLO process and post-processing are performed sequentially, and then mechanical sawing or laser scribing are performed only in the vertical direction (A-A' arrow direction) to provide a light-emitting device as a single chip vertical-structured LED.

On the other hand, the supporting substrates for preparing a semiconductor light-emitting device 54, 56, 58 have the heat-sink layer 520 having a thick thickness of 80 μm to 500 μm as shown in FIGS. 5(c), (d) and (e). In the supporting substrates for preparing a semiconductor light-emitting device 54, 56, 58 having relatively thick thicknesses of the heat-sink layer 520, sawing or laser scribing process are performed in the vertical direction (A-A' arrow direction), and at the same time wet etching of the sacrificial layer 510 is performed in the horizontal direction (B-B' arrow direction) to provide a light-emitting device as a single chip vertical-structured LED.

Preparation Example 3

Preparation of a Supporting Substrate for Preparing a Semiconductor Light-Emitting Device Hereinafter, the supporting substrate for preparing a semiconductor light-emitting device according to an embodiment of the present invention will be described.

Figure 6:
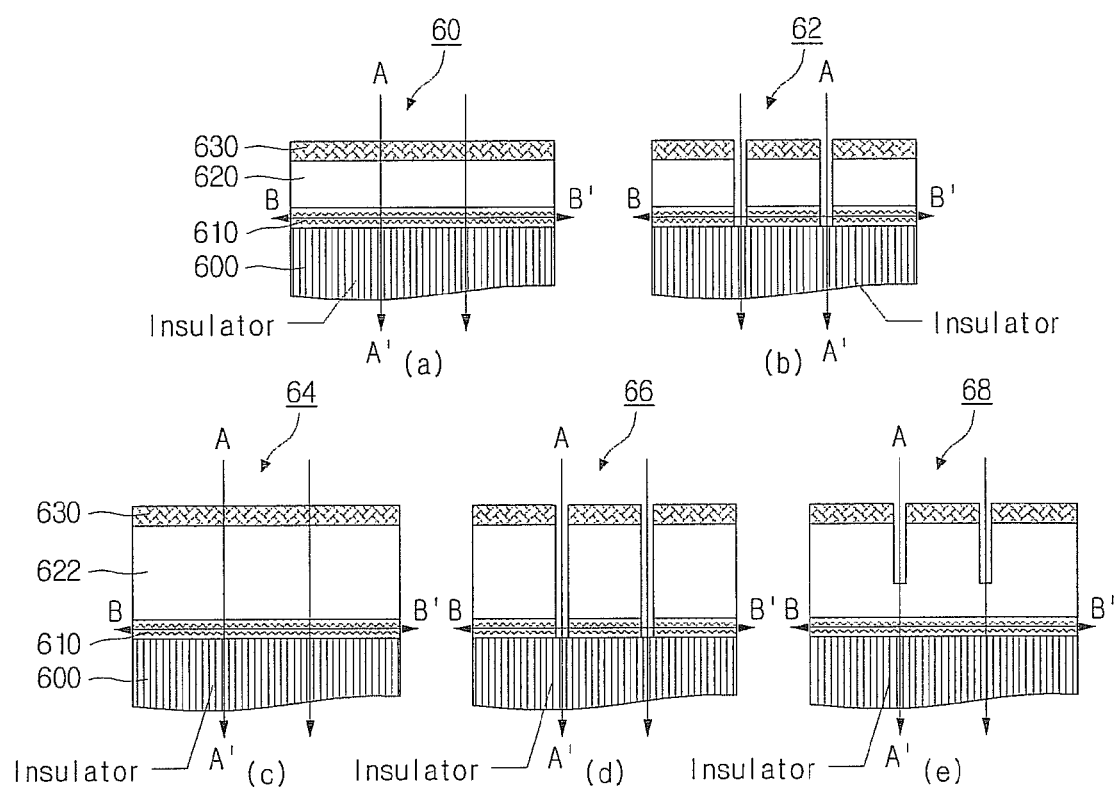
FIG. 6 shows sectional views illustrating examples of various modes of supporting substrates for preparing semiconductor light-emitting devices according to Preparation Example 3 of the present invention.

FIG. 6 is sectional views illustrating supporting substrates for preparing a semiconductor light-emitting device according to another embodiment of the invention. The supporting substrates for preparing a semiconductor light-emitting device 60, 62, 64, 66, 68 are composed of a selected supporting substrate 600.

The selected supporting substrate 600 of the supporting substrates for preparing a semiconductor light-emitting device according to an embodiment can have a difference of 2 ppm or less in thermal expansion coefficient, compared to an initial substrate, and be composed of single crystal, polycrystal, or amorphous substrate wafer such as sapphire ($Al_2O_3$), aluminum nitride (AlN), MgO, AlSiC, BN, BeO, $TiO_2$, $SiO_2$, glass and the like.

The supporting substrates for preparing a semiconductor light-emitting device 60, 62 in FIGS. 6(a) and (b) have a heat-sink layer 620 having a relatively thin thickness of 80 μm or less and include the selected supporting substrate 600 which is thermal and electrical non-conductor. On the other hand, the supporting substrates for preparing a semiconductor light-emitting device 64, 66, 68 in FIGS. 6(c), (d) and (e) have a heat-sink layer 622 having a relatively thick thickness of 80 μm to 500 μm and include the selected supporting substrate 600 which is thermal and electrical non-conductor. FIG. 6(a) and (c) illustrate supporting substrates for preparing a semiconductor light-emitting device which are not patterned, while FIGS. 6(b), (d) and (e) illustrate supporting substrates for preparing a semiconductor light-emitting device which are patterned. As shown in FIG. 6, the supporting substrate for preparing a semiconductor light-emitting device includes a tri-layer. In other words, a sacrificial layer 610, a heat-sink layer 620 and a bonding layer 630 are laminated successively on the upper part of the selected supporting substrate 600.

In particular, the sacrificial layer 610 can be easily soluble in a wet etching solution and thus function to separate the selected supporting substrate 600 from the multi-layered light-emitting structure thin film of the light-emitting device.

The heat-sink layer 620 is composed of metal, alloy or solid solution having an excellent thermal and electric conductivity so as to release a great amount of heat outward generated during the operation of the manufactured vertical-structured light-emitting device and function to form a tight bond between the upper and lower layers and as a supporter.

It is preferable that the heat-sink layer 620 is composed of metal, alloy or solid solution having an excellent and electrical conductivity and includes at least one chosen from Cu, Ni, Ag, Mo, Al, Au, Nb, W, Ti, Cr, Ta, Al, Pd, Pt, and Si and has a thickness of 0.1 μm to 500 μm.

The heat-sink layer 620 can be formed by CVD or PVD, preferably by electro plating or electroless plating.

The bonding layer 630 can use the same material as or a different material from a bonding layer including a diffusion barrier layer laminated/formed on the uppermost part of a first wafer which is a sapphire substrate, on which the Group III nitride-based semiconductor single crystal multi-layered thin film is formed. The bonding layer 630 can be composed of an alloy material of soldering or brazing including at least one chosen from Ga, Bi, In, Sn, Pb, Au, Al, Ag, Cu, Ni, Pd, Si, and Ge.

As shown in FIG. 6(a) to (e), in the supporting substrates for preparing a semiconductor light-emitting device, wafer bonding with a first wafer, LLO process and post-processing are successively performed, and then mechanical sawing or laser scribing to the vertical direction (A-A' arrow direction) are performed at the same time of wet etching of the sacrificial layer 610 to the horizontal direction (B-B' arrow direction) to provide a light-emitting device as a single chip vertical-structured LED, regardless of the thickness of the heat-sink layer 620 laminated on thermally and electrically non-conductive selected supporting substrate 600.

Example 2

Preparation of a Semiconductor Light-Emitting Device Using a Supporting Substrate for Preparing a Semiconductor Light-Emitting Device Preparation Example 1

Preparation of a Semiconductor Light-Emitting Device

Hereinafter, the structure of a semiconductor light-emitting device using a supporting substrate for preparing a semiconductor light-emitting device and its manufacturing method according to an embodiment of the present invention will be described.

Figure 7:
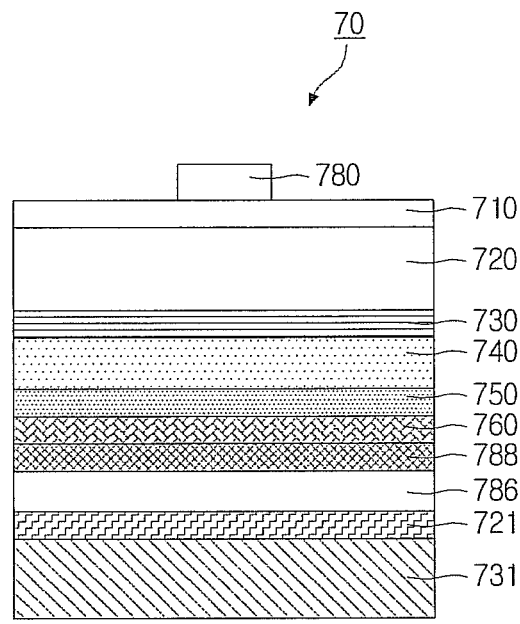
FIG. 7 is a sectional view illustrating the single-chip-type vertical-structured semiconductor light-emitting device manufactured by using the supporting substrate for preparing a semiconductor light-emitting device according to Example 1 of the present invention.

FIG. 7 is a sectional view illustrating a semiconductor light-emitting device manufactured by using the supporting substrate for preparing a semiconductor light-emitting device according to Example 1 of the present invention. A semiconductor light-emitting device 70 in FIG. 7 is a light-emitting device manufactured by using a supporting substrate for preparing a semiconductor light-emitting device including a heat-sink layer 780 having the thin thickness of 80 μm or less.

The semiconductor light-emitting device 70 is formed by laminating a first ohmic contact electrode 780, a buffering layer 710, an n-type semiconductor cladding layer 720, a light-emitting active layer 730, a p-type semiconductor cladding layer 740, a second ohmic contact electrode 750 and a first bonding layer 760, in which a second bonding layer 788, a heat-sink layer 786, a third bonding layer 721 and a third supporting substrate 731 are laminated on the first bonding layer 760. The third supporting substrate 731 can be a single crystal or polycrystal wafer, such as Si, Ge, SiGe, ZnO, GaN, AlGaN, GaAs, or a metal foil such as Mo, Cu, Ni, Nb, Ta, Ti, Au, Ag, Cr, NiCr, CuW, CuMo, NiW and the like, which have an excellent thermal and electric conductivity. The third bonding layer 721, presented between the third supporting substrate 731 and the heat-sink layer 786, can be formed of a thermally stable metal, alloy, or solid solution.

Preferably, the first ohmic contact electrode 780 can be also formed on the upper part of the n-type semiconductor cladding layer 720 after removing the buffering layer 710.

A method for manufacturing a semiconductor light-emitting device having the structure described according to an embodiment will be sequentially described with reference to FIG. 8(a) to (h).

Figure 8:
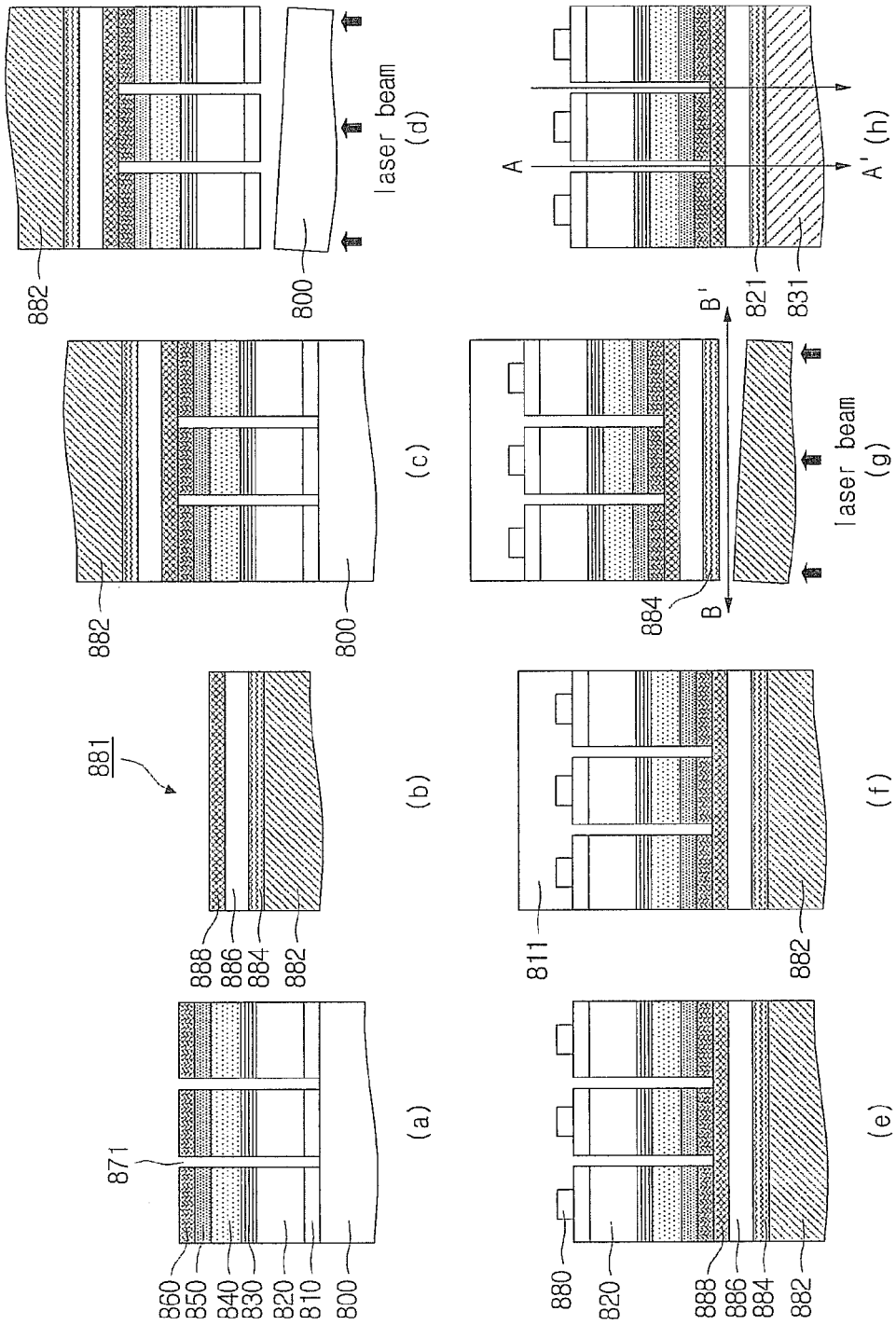
FIG. 8 shows sectional views illustrating a process for manufacturing the vertical-structured semiconductor light-emitting device in Preparation Example 1 of the present invention.

Referring to FIG. 8, a method for manufacturing a semiconductor light-emitting device by using a supporting substrate for preparing a semiconductor light-emitting device according to an embodiment includes: (a) preparing a first wafer in which a Group III-V nitride-based semiconductor multi-layered light-emitting structure is laminated/grown on the upper part of sapphire, which is an initial substrate (see FIG. 8(a)); (b) preparing a second wafer which is a supporting substrate for preparing a semiconductor light-emitting device (see FIG. 8(b)); (c) wafer bonding (see FIG. 8(c)); (d) lifting off the sapphire initial substrate (see FIG. 8(d)); (e) post-processing (see FIG. 8(e) to (h)); and (f) manufacturing a single-chip.

Each process will be described in detail below.

Referring to FIG. 8(a), the step (a) for preparing a first wafer performs laminating and growing a quality semiconductor single crystal multi-layered thin film on a transparent sapphire substrate 800 to lift off the multi-layered light-emitting structure thin film composed of a Group III-V nitride-based semiconductor from the substrate by using the LLO process. A low and high temperature buffering layer 810, which is a general multi-layered light-emitting structure thin film of a light-emitting device, an n-type semiconductor cladding layer 820, a light-emitting active layer 830, and a p-type semiconductor cladding layer 840 are successively laminated/grown on the upper part of the initial substrate sapphire 800 by using the MOCVD and MBE growth systems, which are the most general growth equipments of Group III-V nitride-based semiconductor thin films. Then, a second high reflective ohmic contact electrode 850 is formed on the p-type semiconductor cladding layer and successively a first bonding layer 860 including a diffusion barrier layer 862 is laminated/grown thereon. Trenches 871 are formed up to the sapphire substrate or deeper to form a single chip by using patterning regularly arranged in a plurality of rectangular or square and dry etching before conducting wafer bonding with a second wafer. The second high reflective ohmic contact electrode 850 is formed as a material layer including at least one chosen from Ag, Al, Rh, Pt, Au, Cu, Ni, Pd, metallic silicides, Ag-based alloys, Al-based alloys, Rh-based alloys, CNTNs (carbon nanotube networks), transparent conductive oxides, and transparent conductive nitrides. The diffusion barrier layer 862 is formed as a material layer including at least one chosen from Ti, W, Cr, Ni, Pt, NiCr, TiW, CuW, Ta, TiN, CrN, and TiWN, and the first bonding layer 860 is formed of soldering or brazing alloy including at least one chosen from Ga, Bi, In, Sn, Pb, Au, Al, Ag, Cu, Ni, Pd, Si, and Ge.

The Group III-V nitride-based semiconductor thin film, laminated/grown on the transparent sapphire 800 which is an initial substrate in the step (a) by using metal organic chemical vapor deposition (MOCVD), liquid phase epitaxy, hydride vapor phase epitaxy, molecular beam epitaxy, or metal organic vapor phase epitaxy (MOVPE), can have the composition of $In_x(Ga_yAl_{1-y})N(1=x=0, 1=y=0, x+y>0)$. The multi-layered light-emitting structure of the light-emitting device is formed by directly laminating/growing the low-temperature buffering layer at the temperature of 600° C. or less on the sapphire substrate 800 and further successively laminating/growing the high-temperature buffering layer 810, the Si-doped semiconductor cladding layer 820, the semiconductor light-emitting active layer 830, and Mg-doped semiconductor cladding layer 840. Here, the high-temperature buffering layer 810 can be a Si-doped Group III-V nitride-based semiconductor. The light-emitting active layer 830 can be a single quantum well (SQW) structure or a multi quantum well (MQW) structure composed of a barrier layer of $In_x(Ga_yAl_{1-y})N$ and a well layer of $In_x(Ga_yAl_{1-y})N$, respectively. A light-emitting device having wide band gaps between a long wavelength of InN(~0.7 eV) band gap and a short wavelength of AlN(~6.2 eV) band gap can be manufactured by controlling a composition ratio of In, Ga, Al of the light-emitting active layer 830. The band gap of the well layer can be lower than that of the barrier layer to provide electron and hole carriers to the well to improve the internal quantum efficiency. In particular, at least one of the well layer and barrier layer can be Si-doped or Mg-doped to improve the light-emitting characteristics and lower the forward direction operation voltage.

It is preferable that trenches 871 are formed up to the sapphire substrate or deeper to form a single chip by using patterning regularly arranged in a plurality of rectangles or squares and dry etching before wafer bonding the first wafer to a second wafer, which is the supporting substrate for preparing a semiconductor light-emitting device 881. It is also possible to apply the first wafer without trenches.

Referring to FIG. 8(b), the (b) step is to prepare the second wafer which is the supporting substrate for preparing a semiconductor light-emitting device 881. The supporting substrate for preparing a semiconductor light-emitting device 881 is formed by successively laminating a sacrificial layer 884, a heat-sink layer 886, and a second bonding layer 888 on the upper part of a selected supporting substrate 882.

In more detail, the selected supporting substrate 882 can be an electrical insulating material having a difference of thermal expansion coefficient of 2 ppm or less from an initial substrate and be formed of one chosen from single crystal, polycrystal, or amorphous substrate wafer such as sapphire ($Al_2O_3$), aluminum nitride (AlN), MgO, AlSiC, BN, BeO, $TiO_2$, $SiO_2$, glass and the like.

The sacrificial layer 884 which is the first layer formed on the selected supporting substrate 882 can be a single crystal, polycrystal, or amorphous material bonded with nitrogen or oxygen including GaN, InGaN, ZnO, InN, $In_2O_3$, ITO, $SnO_2$, $Si_3N_4$, $SiO_2$, BeMgO, MgZnO and the like in order to conduct the unifying process using a laser beam which is a strong energy source when a single-chip is finally manufactured, or it can be also a Si-single crystal, polycrystal, or amorphous material.

The heat-sink layer 886, which is the second layer formed on the selected supporting substrate 882 and is formed with a material having a superior thermal and electrical conductivity, can be metal, alloy, solid solution, and semiconductor material to easily release a great amount of heat outward generated during the operation of the manufactured vertical-structured light-emitting device and function as a supporter of the multi-layered light-emitting structure of the light-emitting device. The heat-sink layer can have a relatively thin thickness of 80 μm or less.

The second bonding layer 888, which is the third layer formed on the selected supporting substrate 882 and wafer-bonded with the first wafer, can be the same material as that of the first bonding layer 860, which is placed in the most upper part of the first wafer, but it can be also composed of different materials. The three layers formed on the selected supporting substrate of the supporting substrate for preparing a semiconductor light-emitting device can be formed through physical or chemical vapor deposition, and in particular, the heat-sink layer 886 can be formed through electro plating or electroless plating.

The selected supporting substrate 882 comprised in the supporting substrate for preparing a semiconductor light-emitting device 881 can be one chosen from sapphire ($Al_2O_3$), AlN, MgO, AlSiC, BN, BeO, $TiO_2$, $SiO_2$ substrate and the like which is an electrical insulator and the sacrificial layer 884 can be a single crystal, polycrystal, or amorphous material layer bonded with nitrogen or oxygen including GaN, InGaN, ZnO, InN, $In_2O_3$, ITO, $SnO_2$, Si3N4, $SiO_2$, BeMgO, MgZnO and the like or a Si single crystal, polycrystal, or amorphous material layer. The heat-sink layer 886, which is relatively thin, can be formed with a high thermal and electrical conductivite metal, alloy or solid solution including at least one chosen from Cu, Ni, Ag, Mo, Al, Au, Nb, W, Ti, Cr, Ta, Al, Pd, Pt, and Si, or a material including at least one chosen from nitrides and oxides thereof. The second bonding layer 888 can be a soldering or brazing alloy material including at least one chosen from Ga, Bi, In, Sn, Pb, Au, Al, Ag, Cu, Ni, Pd, Si, and Ge. However, they are not limited thereto.

Referring to FIG. 8(c), the wafer bonding in the step (c) bonds the first wafer and the second wafer by a thermo-compressive method. Thermo compression bonding in the step (c) can be performed at the temperature of 100° C. to 600° C. and the pressure of 1 Mpa to 200 Mpa.

Referring to FIG. 8(d), the step (d) is a step to lift off the sapphire substrate. When a laser beam, which is a strong energy source, is irradiated to the back side of the transparent sapphire, the interface between the semiconductor single crystal multi-layered light-emitting structure and the sapphire substrate absorbs the strong laser so that the sapphire substrate is lifted off by thermo-chemical dissociation of gallium nitride (GaN) existing in the interface.

It is preferable that the laser beam, which is a strong energy source, first irradiates to the back side of the transparent sapphire substrate to cause thereto-chemical dissociation to lift off the initial substrate 800 in the step (d). Here, it is preferable that a step is further included to treat the surface of the Group III-V nitride-based semiconductor thin film, which is exposed to air, with at least one chosen from $H_2SO_4$, HCl, KOH, and BOE at the temperature of 30° C. to 200° C. It is also preferred that the initial substrate 800 is completely removed through the mechanical-chemical polishing and sequential wet etching process. The wet etching process of the sapphire substrate 800 can be performed in an etching solution chosen from sulfuric acid ($H_2SO_4$), chromic acid ($CrO_3$), phosphoric acid ($H_3PO_4$), gallium (Ga), magnesium (Mg), indium (In), aluminum (Al) and a mixture thereof. A temperature of the wet etching solution can be 200° C. or higher.

Referring to FIG. 8(e), the post-processing in the step (e) can include cleaning, passivation of the light-emitting device, dry-etching, first ohmic contact electrode material deposition and annealing, etc.

The first ohmic contact electrode 880, which is thermally stable, is formed on the upper part of the buffering layer 810 or the n-type semiconductor cladding layer 820 through the first ohmic contact electrode material deposition and annealing process. It is preferable that the step of electric passivation on the surface or sides of the Group III nitride-based semiconductor is further included by using at least one chosen from $Si_3N_4$, $SiO_2$, or electric insulating materials. In addition, the first ohmic contact electrode 880 can be formed of a material including at least one chosen from Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare earth metals and alloys, metallic silicides, semiconducting silicides, CNTNs (carbonnanotube networks), transparent conducting oxides (TCO), transparent conducting nitrides, and TCNs.

Figure 5:
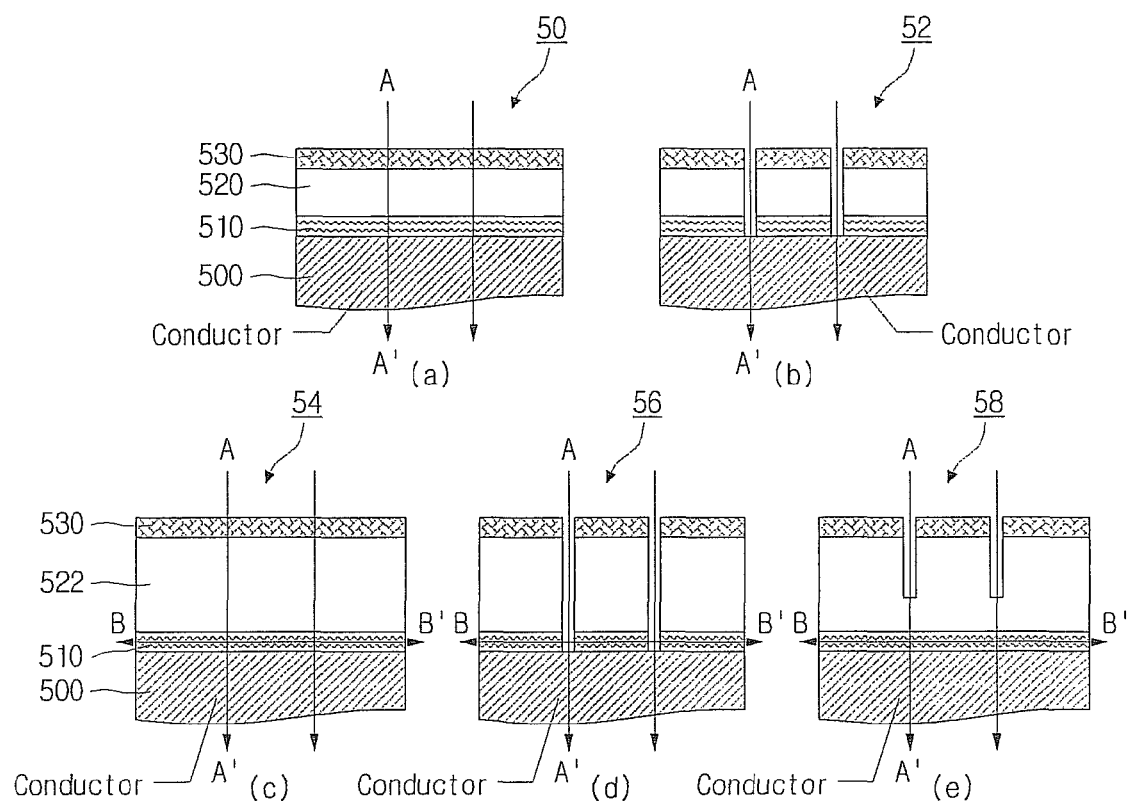
FIG. 5 shows sectional views illustrating examples of various modes of supporting substrates for preparing semiconductor light-emitting devices according to Preparation Example 2 of the present invention.

The step (f) of manufacturing a single chip can provide the final single-chip-type light-emitting device structure through the wafer bonding (step (c)) according to the thickness of the heat-sink layer 886 (which is 80 μm or less) of the supporting substrate for preparing a semiconductor light-emitting device of the step (b) and post processing as shown in FIG. 5.

Referring to FIG. 8(f), when the thickness of the heat-sink layer 886 of the supporting substrate for preparing a semiconductor light-emitting device 881 is 80 μm or less, a temporary supporting substrate (hereinafter referred to as "TSS) 811 formed of organic or inorganic bonding materials is attached in the opposite direction of the supporting substrate for preparing a semiconductor light-emitting device. The selected supporting substrate 882, which is an electrical insulator, is then separated and removed by thermo-chemical dissociation of the sacrificial layer 884 selecting a laser beam having an appropriate absorption wavelength range according to the material used for the sacrificial layer 884 as shown in FIG. 8(g). The final LED chip of the light-emitting device in FIG. 7 is manufactured by bonding a third supporting substrate 831 composed of an electrically conductive material and the heat-sink layer 886 using the bonding layer 821 composed of electrically conductive soldering or brazing metal or alloy, and cutting vertically (A-A' arrow direction of FIG. 8(h)).

Preparation Example 2

Preparation of a Semiconductor Light-Emitting Device

A semiconductor light-emitting device manufactured by using the supporting substrate for preparing a semiconductor light-emitting device according to Preparation Example 1 and a method for manufacturing thereof will be described with reference to FIG. 9 and FIG. 10.

Figure 9:
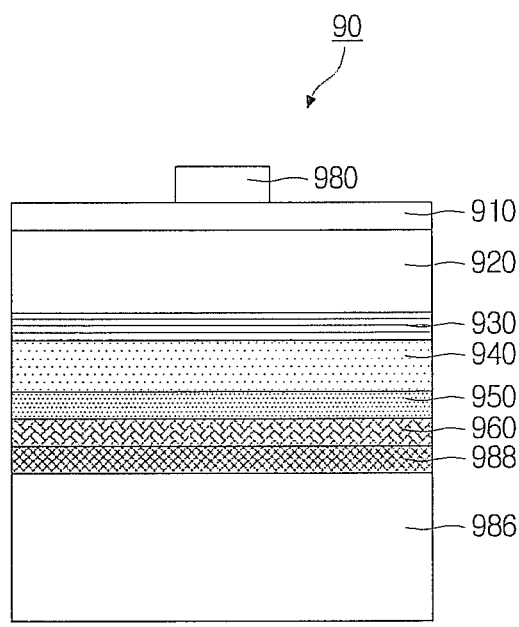
FIG. 9 is a sectional view illustrating the final single-chip-type vertical-structured semiconductor light-emitting device in Preparation Example 2 manufactured by using the supporting substrate for preparing a semiconductor light-emitting device of the present invention.
Figure 10:
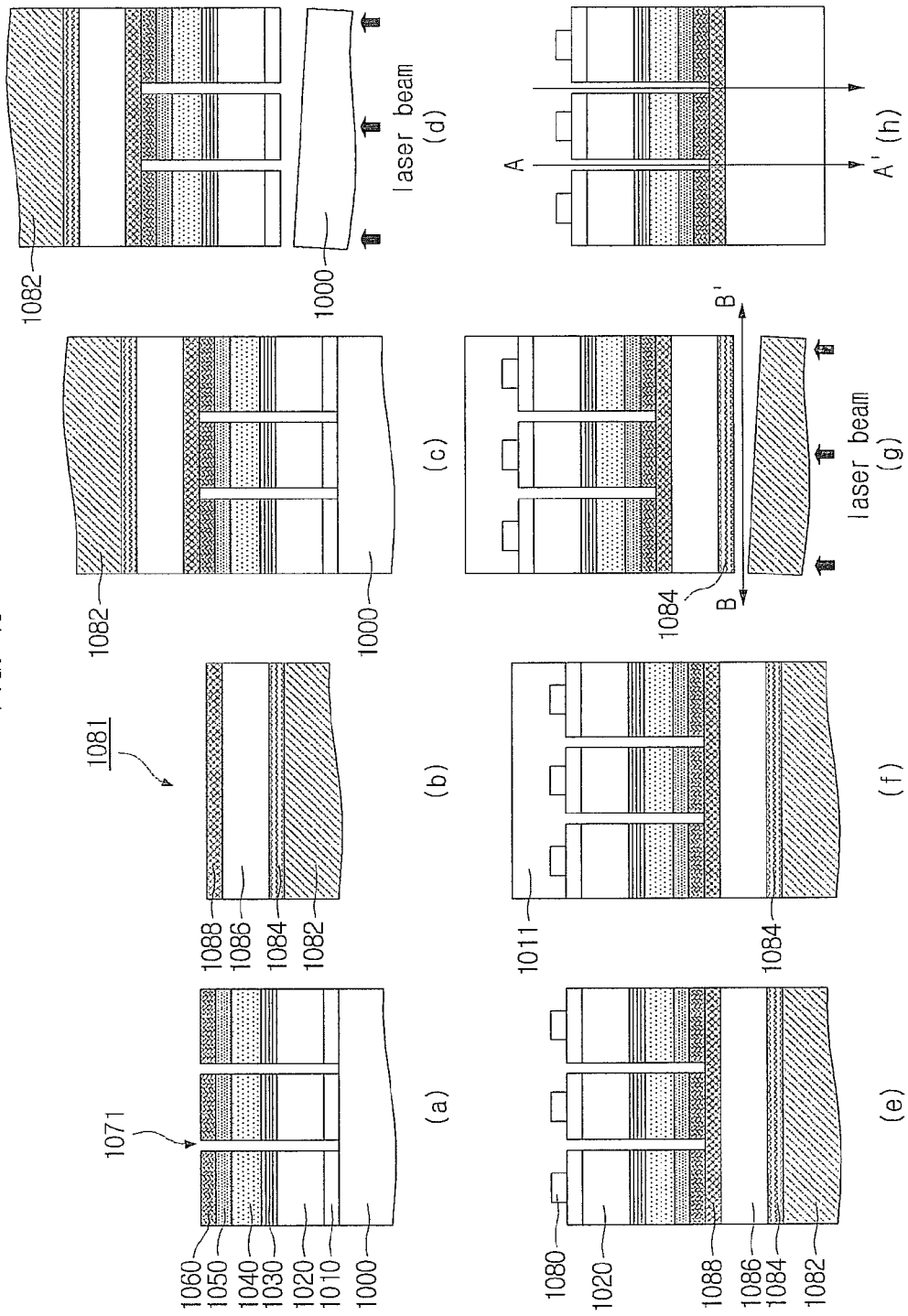
FIG. 10 shows sectional views illustrating a process of manufacturing the vertical-structured semiconductor light-emitting device according to Preparation Example 2 of the present invention.

FIG. 9 is a sectional view illustrating the semiconductor light-emitting device manufactured by using the supporting substrate for preparing a semiconductor light-emitting device according to an embodiment of the present invention.

A supporting substrate for preparing a semiconductor light-emitting device according to an embodiment of the invention has the same layered structure and manufacturing process with the supporting substrate for preparing a semiconductor light-emitting device of Example 1 described above, except a thicker thickness of a heat-sink layer 986 which is 80 μm to 500 μm.

A semiconductor light-emitting device 90 in FIG. 9 is a light-emitting device manufactured by using a supporting substrate for preparing a semiconductor light-emitting device having a thicker heat-sink layer, in which the heat-sink layer, laminated on the upper part of the selected supporting substrate of the supporting substrate for preparing a semiconductor light-emitting device, has the thickness of 80 μm to 500 μm which is relatively thicker.

As shown in FIG. 9, the semiconductor light-emitting device 90 is formed by laminating a first ohmic contact electrode 980, a buffering layer 910, an n-type semiconductor cladding layer 920, a light-emitting active layer 930, a p-type semiconductor cladding layer 940, a second ohmic contact electrode and a first bonding layer 960. A second bonding layer 988 and a heat-sink layer 986 are formed on the first bonding layer 960. Therefore, in the semiconductor light-emitting device 90, manufactured by using a supporting substrate for preparing a semiconductor light-emitting device according to an embodiment of the invention, the thick heat-sink layer 986 can support the multi-layered light-emitting structure of the semiconductor light-emitting device without having a supporter as a third supporting substrate after removing the selected supporting substrate, which is an electrical insulator, by conducting the LLO process through the sacrificial layer.

It is preferable that the first ohmic contact electrode 980 is also formed on the upper part of the n-type semiconductor cladding layer 920 after removing the buffering layer 910.

FIG. 10(a) to (h) are sectional views illustrating sequentially a process of manufacturing the high performance vertical-structured light-emitting device by using the supporting substrate for preparing a semiconductor light-emitting device according to an embodiment of the present invention. FIG. 10(a) to (g) are the same as in FIGS. 8(a) to (g), except the thickness of the heat-sink layer 1086 of the supporting substrate for preparing a semiconductor light-emitting device. Thus, the redundant description will be omitted.

As shown in FIGS. 10(a) to (g), after the semiconductor light-emitting device is manufactured by using the supporting substrate for preparing a semiconductor light-emitting device of the present invention through the method in Example 1, the selected supporting substrate 1082 of the supporting substrate for preparing a semiconductor light-emitting device is removed. As shown in FIG. 10(*h*), an LED chip of the semiconductor light-emitting device 90 in FIG. 9 is finally prepared by making a cut vertically (A-A' arrow direction of FIG. 10(*h*)). The supporting substrate for preparing a semiconductor light-emitting device 1081, used for manufacturing the semiconductor light-emitting device 90 according to an embodiment of the invention, including the thick heat-sink layer 1086, can support the multi-layered semiconductor light-emitting device by the thick heat-sink layer without having an additional third supporting substrate.

Preparation Example 3

Preparation of a Semiconductor Light-Emitting Device

The structure of a semiconductor light-emitting device manufactured by using the supporting substrate for preparing a semiconductor light-emitting device according to Example 1 and a method for manufacturing thereof will be described in detail with reference to FIG. 11 and FIG. 12.

Figure 11:
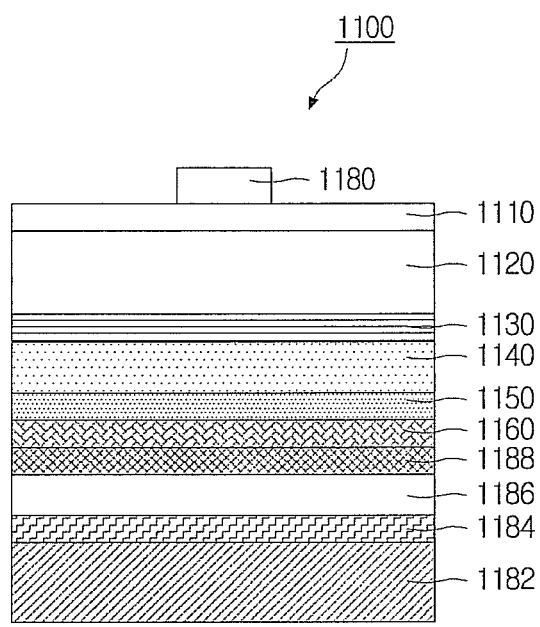
FIG. 11 is a sectional view illustrating the final single-chip-type vertical-structured semiconductor light-emitting device in Preparation Example 3 manufactured by using the supporting substrate for preparing a semiconductor light-emitting device of the present invention.

FIG. 11 is a sectional view illustrating the semiconductor light-emitting device 1100 manufactured by using the supporting substrate for preparing a semiconductor light-emitting device of Example 1 of the present invention. As shown in FIG. 11, the semiconductor light-emitting device 1100 is formed by laminating a first ohmic contact electrode 1180, a buffering layer 1110, an n-type semiconductor cladding layer 1120, a light-emitting active layer 1130, a p-type semiconductor cladding layer 1140, a second ohmic contact electrode 1150, and a first bonding layer 1160, a second bonding layer 1188, a heat-sink layer 1186, a sacrificial layer 1184 and a selected supporting substrate 1182 are laminated and formed in the first bonding layer 1160.

In particular, the first ohmic contact electrode 1180 can be also formed on the upper part of the n-type semiconductor cladding layer 1120 after removing the buffering layer 1110.

The selected supporting substrate 1182 of the supporting substrate for preparing a semiconductor light-emitting device 1180, used for manufacturing the semiconductor light-emitting device according to an embodiment of the invention, is an electric conductor, and the semiconductor light-emitting device is manufactured regardless of the thickness of the heat-sink layer 1186 of the supporting substrate for preparing a semiconductor light-emitting device. The selected supporting substrate of the supporting substrate for preparing a semiconductor light-emitting device can be selectively separated according to the thickness of the heat-sink layer 1186 of the supporting substrate for preparing a semiconductor light-emitting device in the process of preparing a final single chip. In this case, when the thickness of the heat-sink layer is 80 μm or greater, the selected supporting substrate can be separated and removed by dissolving the sacrificial layer in a wet etching solution.

A method for manufacturing the semiconductor light-emitting device 1100 having the described structure according to an embodiment of the invention will be sequentially described with reference to FIG. 12(*a*) to (*f*).

Figure 12:
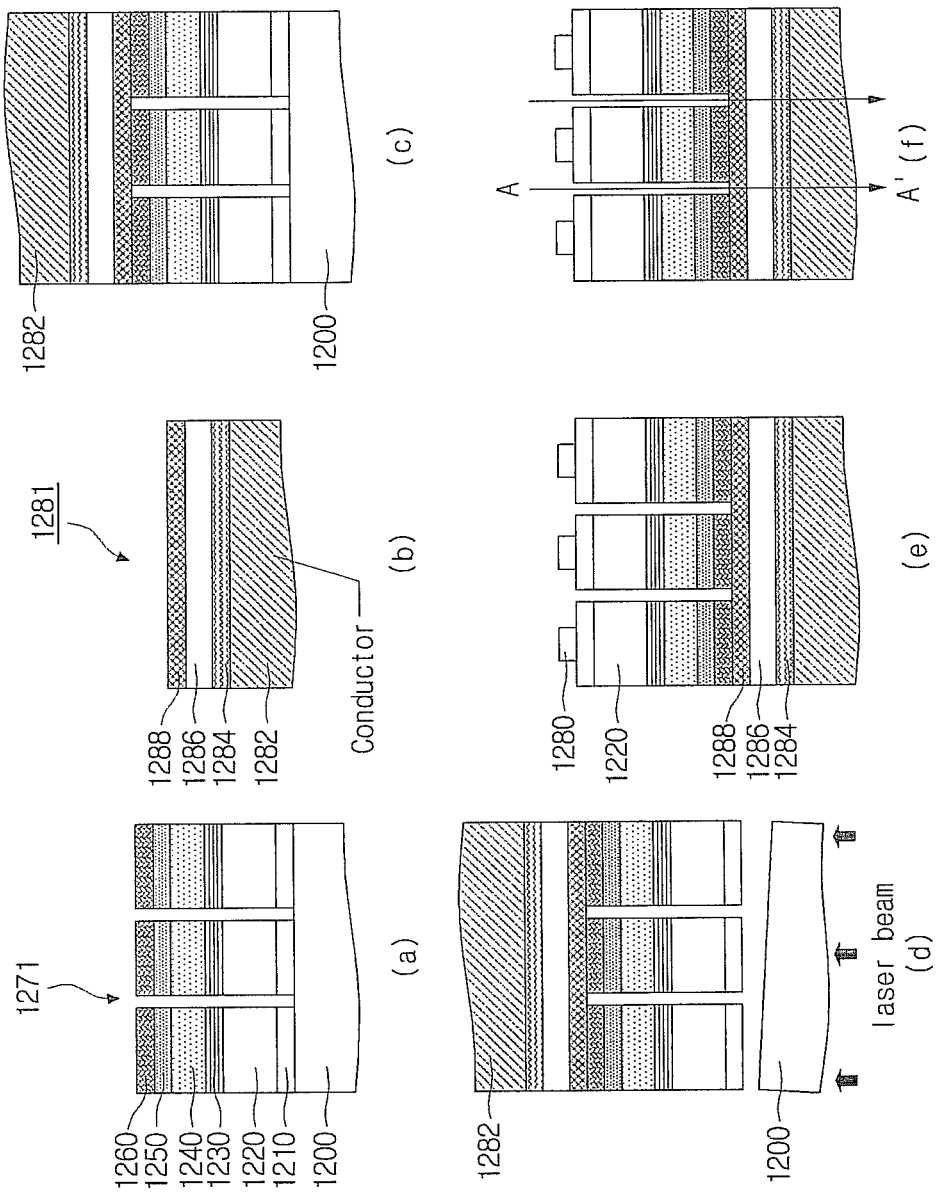
FIG. 12 is sectional views illustrating a process of manufacturing the semiconductor light-emitting device according to Preparation Example 3 of FIG. 11.

Referring to FIG. 12, a method for manufacturing the semiconductor light-emitting device 1100 by using the supporting substrate for preparing a semiconductor light-emitting device of the invention includes: (a) preparing a first wafer in which a Group III-V nitride-based semiconductor multi-layered light-emitting structure is laminated/grown on a sapphire initial substrate (see FIG. 12(*a*)); (b) preparing a second wafer which is the supporting substrate for preparing a semiconductor light-emitting device 780 (see FIG. 12(*b*)); (c) wafer bonding (see FIG. 12 (*c*)); (d) lifting off the sapphire initial substrate (see FIG. 12(*d*)); (e) post-processing (see FIG. 12 (*e*)); and (f) manufacturing a single chip (see FIG. 12 (*f*)).

Hereinafter, each process will be described in detail.

Referring to FIG. 12(*a*), the step (a) of preparing a first wafer is performed by laminating/growing a high quality semiconductor single crystal multi-layered thin film on the transparent sapphire substrate in order to lift off the multi-layered light-emitting structure thin film composed of Group III-V nitride-based semiconductor from the substrate through the LLO process. A low and high temperature buffering layer 1210, which is a general multi-layered light-emitting structure thin film of a light-emitting device, an n-type semiconductor cladding layer 1220, a light-emitting active layer 1230, and a p-type semiconductor cladding layer 1240 are successively laminated/grown on the upper part of the initial substrate sapphire 1200 by using the MOCVD and MBE growth systems which are the most general growth equipments of Group III-V nitride-based semiconductor thin films.

Then, a second high reflective ohmic contact electrode 1250 is formed on the p-type semiconductor cladding layer which is the uppermost layer of the multi-layered light-emitting structure thin film, and a first bonding layer 1260 including a diffusion barrier layer is successively laminated/grown thereon.

Trenches 1271 are formed up to the sapphire substrate or deeper to form a single chip by using patterning regularly arranged in a plurality of rectangles or squares and a, dry etching process before conducting wafer bonding with a second wafer, which is the supporting substrate for preparing a semiconductor light-emitting device 1281. In some cases, a first wafer which does not have trenches can be also applied. The second high reflective ohmic contact electrode 1250 is formed as a material layer including at least one chosen from Ag, Al, Rh, Pt, Au, Cu, Ni, Pd, metallic silicides, Ag-based alloy, Al-based alloy, Rh-based alloy, CNTNs (carbon nanotube networks), transparent conductive oxides, and transparent conductive nitrides. The diffusion barrier layer is formed as a material layer including at least one chosen from Ti, W, Cr, Ni, Pt, NiCr, TiW, CuW, Ta, TiN, CrN, and TiWN, and the first bonding layer 1260 is formed of a soldering or brazing alloy including at least one chosen from Ga, Bi, In, Sn, Pb, Au, Al, Ag, Cu, Ni, Pd, Si, and Ge.

The Group III-V nitride-based semiconductor thin film, laminated/grown on the transparent sapphire 1200, which is an initial substrate, in the step (a) by using metal organic chemical vapor deposition (MOCVD), liquid phase epitaxy, hydride vapor phase epitaxy, molecular beam epitaxy, or metal organic vapor phase epitaxy (MOVPE), can have the composition of $In_x(Ga_yAl_{1-y})N(1=x=0, 1=y=0, x+y>0)$.

The high temperature buffering layer 1210 can be a Si-doped Group III-V nitride-based semiconductor. The semiconductor light-emitting active layer 1230 can be a single quantum well (SQW) structure or a multi quantum well (MQW) structure composed of a barrier layer of $In_x(Ga_yAl_{1-y})N$ and a well layer of $In_x(Ga_yAl_{1-y})N$, respectively. A light-emitting device having wide band gaps between a long wavelength of InN(~0.7 eV) band gap and a short wavelength of AlN(~6.2 eV) band gap can be manufactured by controlling the composition ratio of In, Ga, Al of the light-emitting active layer 1230. The band gap of the well layer of the light-emitting active layer 1230 can be lower than that of the barrier layer to provide electron and hole carriers to the well to improve the internal quantum efficiency. In particular, at least one of the well layer and the barrier layer can be Si-doped or Mg-doped to improve the light emitting characteristics and lower the forward direction operation voltage.

It is preferable that at least one annealing process is performed to the first wafer to not only form a second high reflective ohmic contact electrode but also improve interfacial adhesion between the layers before the wafer bonding.

Referring to FIG. 12(b), the (b) step is to prepare the second wafer which is the supporting substrate for preparing a semiconductor light-emitting device 1281. The supporting substrate for preparing a semiconductor light-emitting device 1281 is formed by successively laminating a sacrificial layer 1284, a heat-sink layer 1286, and a second bonding layer 1288 on the upper part of a selected supporting substrate 1282. As described above, the thermal expansion coefficient (TEC) of the supporting substrate for preparing a semiconductor light-emitting device 1281 composed with three layers on the selected supporting substrate 1282 can be similar or identical to that of the sapphire or nitride-based semiconductor which is an initial substrate.

The selected supporting substrate 1282 can be a single crystal, polycrystal, or amorphous wafer such as Si, Ge, SiGe, ZnO, GaN, AlGaN, GaAs and the like, or a metal foil such as Mo, Cu, Ni, Nb, Ta, Ti, Au, Ag, Cr, NiCr, CuW, CuMo, NiW and the like, which have superior thermal and electric conductivity. In addition, the sacrificial layer 1284 presented between the selected supporting substrate 1282 and the heat-sink layer 1286 can be composed of a thermally stable metal, alloy, or solid solution.

In more detail, the sacrificial layer 1284, which is the first layer, can be metal, alloy, solid solution, semiconductor, insulator or the like which can be quickly dissolved in a wet etching solution so that manufacturing a final single chip can be smoothly carried out without causing thermal/mechanical shocks to the neighboring single chips during the unifying process.

The heat-sink layer 1286 formed of a material having superior thermal and electric conductivity, which is the second layer, can be metal, alloy, solid solution, semiconductor material which can easily dissipate heat outward generated during the operation of the light-emitting device and support the multi-layered light-emitting structure which is the light-emitting device.

The second bonding layer 1288, which is the third layer, can be the same material as that of the first bonding layer 1260, which is positioned at the uppermost part of the first wafer, for wafer bonding with the first wafer, but can be also composed with a different material. The three layers laminated on the upper part of the selected supporting substrate of the supporting substrate for preparing a semiconductor light-emitting device can be formed by physical vapor deposition or chemical vapor deposition, preferably by an electro plating or electroless plating process.

The sacrificial layer 1284 can be formed of a material including at least one chosen from AlAs, SiO$_2$, Si3N4, ITO, Sn$_2$O, In$_2$O$_3$, ZnO, ZnS, ZnSe, CrN, TiN, Cr, various metals, alloys, and oxides. The heat-sink layer 1286 can be formed of a material including at least one chosen from various metals or alloys including at least one chosen from Cu, Ni, Ag, Mo, Al, Au, Nb, W, Ti, Cr, Ta, Al, Pd, Pt, and Si, regardless of the thickness. The second bonding layer 1288 can be formed of soldering or brazing alloy including at least one chosen from Ga, Bi, In, Sn, Pb, Au, Al, Ag, Cu, Ni, Pd, Si, Ge, and the like.

Referring to FIG. 12(c), the wafer bonding in the step (c) bonds the first wafer and the second wafer by a thermo-compressive method. Thermo compression bonding in the step (c) can be performed at the temperature of 100° C. to 600° C. and the pressure of 1 Mpa to 200 Mpa.

Referring to FIG. 12(d), the step (d) is a step for lifting off the sapphire substrate through the LLO process. When a laser beam, which is a strong energy source, is irradiated to the back side of the transparent sapphire, the interface between the semiconductor single crystal multi-layered light-emitting structure and the sapphire substrate absorbs strong laser so that the sapphire substrate is lifted off by thermo-chemical dissociation of gallium nitride (GaN) existing in the interface. Here, there can be an additional step of treating the surface of the Group III-V nitride-based semiconductor thin film, which is exposed to air, with at least one chosen from H$_2$SO$_4$, HCl, KOH, and BOE at the temperature of 30° C. to 200° C. It is also preferable that the initial substrate 1200 is completely removed through the mechanical-chemical polishing and sequential wet etching process. The wet etching process of the sapphire substrate 1200 can be performed in an etching solution chosen from sulfuric acid (H$_2$SO$_4$), chromic acid (CrO$_3$), phosphoric acid (H$_3$PO$_4$), gallium (Ga), magnesium (Mg), indium (In), aluminum (Al) and a mixture thereof. The temperature of the wet etching solution may be 200° C. or higher.

Referring to FIG. 12(e), the post-processing in the step (e) may include cleaning, passivation of the light-emitting device, dry-etching, first ohmic contact electrode material deposition and annealing, etc.

The first ohmic contact electrode 1280, which is thermally stable, is formed on the upper part of the buffering layer 1210 or the n-type semiconductor cladding layer 1220 through the first ohmic contact electrode material deposition and annealing process. It is preferable that the step of electric passivation on the surface or sides of the Group III nitride-based semiconductor device is further included by using at least one chosen from Si$_3$N$_4$, SiO$_2$, or various electric insulating materials.

In addition, the first ohmic contact electrode 1280 can be formed of a material including at least one chosen from Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare earth metals and alloys, metallic silicides, semiconducting silicides, CNTNs (carbonnanotube networks), transparent conducting oxides (TCO), transparent conducting nitrides, and TCNs.

Referring to FIG. 12(f), the step (f) is a step for manufacturing the final unified single chip. In the process for manufacturing the single chip, the supporting substrate for preparing a semiconductor light-emitting device 1281, which is formed of the second bonding layer 1288, the heat-sink layer 1286, the sacrificial layer 1284, and the selected supporting substrate 1282, can be cut only vertically (A-A' arrow direction) to provide a unified light-emitting device chip in FIG. 11. The sacrificial layer 1284 existing between the selected supporting substrate 1282 and the heat-sink layer 1286 functions not only to separate the selected supporting substrate from the heat-sink layer but also to form a bond between layers by being dissolved in a wet etching solution.

Preparation Example 4

Preparation of a Semiconductor Light-Emitting Device

The structure of a semiconductor light-emitting device manufactured by using the supporting substrate for preparing a semiconductor light-emitting device according to Example 2 and a method for manufacturing thereof will be described in detail with reference to FIG. 13 and FIG. 14.

Figure 13:
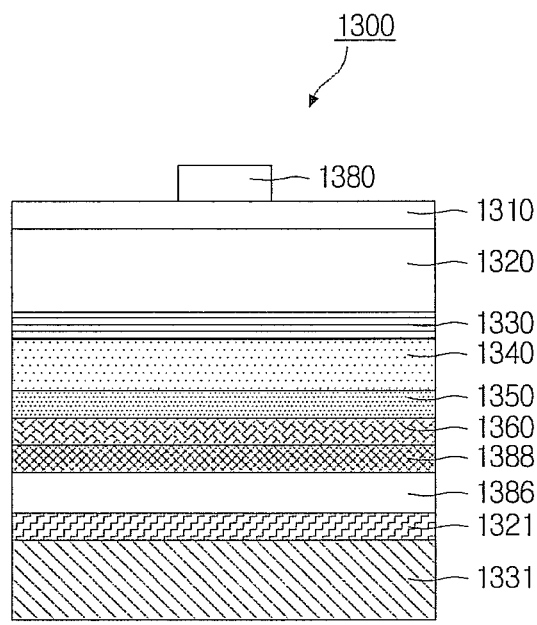
FIG. 13 is a sectional view illustrating the final single-chip-type vertical-structured semiconductor light-emitting device in Preparation Example 4 manufactured by using the supporting substrate for preparing a semiconductor light-emitting device of the present invention.

FIG. 13 is a sectional view illustrating the semiconductor light-emitting device 1300 manufactured by using the supporting substrate for preparing a semiconductor light-emitting device of Example 2 of the present invention. As shown in FIG. 13, the semiconductor light-emitting device 1300 is formed by laminating a first ohmic contact electrode 1380, a buffering layer 1310, an n-type semiconductor cladding layer 1320, a light-emitting active layer 1330, a p-type semiconductor cladding layer 1340, a second ohmic contact electrode 1350 and a first bonding layer 1360. The first bonding layer 1360 is formed by laminating a second bonding layer 1388, a heat-sink layer 1386, a third bonding layer 1321 and a third supporting substrate 1331.

In particular, the first ohmic contact electrode 1380 can be also formed on the n-type semiconductor cladding layer 1320 after the buffering layer 1310 is removed.

The selected supporting substrate of the supporting substrate for preparing a semiconductor light-emitting device, used for manufacturing the semiconductor light-emitting device according to an embodiment of the invention, is formed of a single crystal, polycrystal, or amorphous substrate wafer such as sapphire (Al$_2$O$_3$), aluminum nitride (AlN), MgO, AlSiC, BN, BeO, TiO$_2$, SiO$_2$, glass and the like which has the difference of thermal expansion coefficient of 2 ppm or less from the initial substrate. The semiconductor light-emitting device can have the heat-sink layer 1386 of the supporting substrate for preparing a semiconductor light-emitting device, having the thickness of 80 μm or less, which is relatively thin.

The selected supporting substrate in the semiconductor light-emitting device according to an embodiment of the invention can be separated and removed through the sacrificial layer, and the new third supporting substrate 1331 is formed through the third bonding layer 1321 by wafer bonding. The third supporting substrate 1331 can be a single crystal or polycrystal wafer such as Si, Ge, SiGe, ZnO, GaN, AlGaN, GaAs and the like, or a metal foil such as Mo, Cu, Ni, Nb, Ta, Ti, Au, Ag, Cr, NiCr, CuW, CuMo, NiW and the like, which have a superior thermal and electric conductivity. The third bonding layer 1321 existing between the third supporting substrate 1331 and the heat-sink layer 1386 can be formed of a thermally stable metal, alloy or solid solution.

A process for manufacturing the semiconductor light-emitting device 1300 having the structure described above according to an embodiment will be sequentially described below with reference to FIG. 14(a) to (h). In the process for manufacturing the semiconductor light-emitting device 1300 by using supporting substrate for preparing a semiconductor light-emitting device according to an embodiment, the description that is redundant with the process in Example 1 will be omitted.

Referring to FIG. 14(a), in the step (a), a first wafer is prepared by forming a semiconductor multi-layered light-emitting structure on an initial substrate of transparent sapphire 1400. The semiconductor multi-layered light-emitting structure thin film is formed by successively laminating/growing a low and high temperature buffering layer 1410, an n-type semiconductor cladding layer 1420, a light-emitting active layer 1430, and a p-type semiconductor cladding layer 1440.

Then, a second high reflective ohmic contact electrode 1450 is formed on the p-type semiconductor cladding layer 1440 which is the uppermost part of the multi-layered light-emitting structure thin film, and then a first bonding layer 1460 including a diffusion barrier layer is successively formed thereon.

In addition, it is preferable that trenches 1471 is formed up to the sapphire substrate or deeper to form a single chip by using patterning regularly arranged in a plurality of rectangles or squares and a dry etching process before conducting wafer bonding with a second wafer, which is the supporting substrate for preparing a semiconductor light-emitting device 1481. In some cases, a first wafer, which does not have trenches, can be also applied.

The second high reflective ohmic contact electrode 1450 is formed as a material layer including at least one chosen from Ag, Al, Rh, Pt, Au, Cu, Ni, Pd, metallic silicides, Ag-based alloys, Al-based alloys, Rh-based alloys, CNTNs (carbon nanotube networks), transparent conductive oxides, and transparent conductive nitrides. The first bonding layer 1460 is formed of a soldering or brazing alloy including at least one chosen from Ga, Bi, In, Sn, Pb, Au, Al, Ag, Cu, Ni, Pd, Si, and Ge.

Referring to FIG. 14(b), in the step (b), a supporting substrate for preparing a semiconductor light-emitting device 1481 is prepared. The supporting substrate for preparing a semiconductor light-emitting device 1481 used in an embodiment of the invention is formed by successively laminating a sacrificial layer 1484, a heat-sink layer 1486 having a relatively thin thickness of 80 μm or less, and a second bonding layer 1488.

The selected supporting substrate 1482 is formed of a single crystal, polycrystal, or amorphous substrate wafer such as sapphire (Al$_2$O$_3$), aluminum nitride (AlN), MgO, AlSiC, BN, BeO, TiO$_2$, SiO$_2$, glass and the like which have the difference of thermal expansion coefficient of 2 ppm or less from the initial substrate and are electrical insulating materials. The sacrificial layer 1484 is formed of a material including at least one chosen from AlAs, SiO$_2$, Si$_3$N$_4$, ITO, SnO$_2$, In$_2$O$_3$, ZnO, ZnS, ZnSe, CrN, TiN, Cr, various metals, alloys, and oxides. The thin heat-sink layer 1486 is formed of a material including at least one chosen from various metals and alloys including at least one chosen from Cu, Ni, Ag, Mo, Al, Au, Nb, W, Ti, Cr, Ta, Al, Pd, Pt, and Si. The second bonding layer 1488 is formed of a soldering or brazing alloy including at least one chosen from Ga, Bi, In, Sn, Pb, Au, Al, Ag, Cu, Ni, Pd, Si, and Ge.

Referring to FIG. 14(c), in the wafer bonding in the step (c), the first wafer and the second wafer are bonded by a thermocompressive method. Thermo compression bonding in the step (c) can be performed at the temperature of 100° C. to 600° C. and the pressure of 1 Mpa to 200 Mpa.

Referring to FIG. 14(d), the step (d) is a step for lifting off the sapphire substrate 1400 through the LLO process.

Referring to FIG. 14(e), the step (e) is a post-processing step. The post processing can further include forming a first ohmic contact electrode 1480 which is thermally stable on the buffering layer 1410 or the n-type semiconductor cladding layer 1420 through the first ohmic contact electrode material deposition and annealing process, and performing electrical passivation on the surface or sides of the Group III nitride-based semiconductor device by using at least one chosen from Si$_3$N$_4$, SiO$_2$, or various electric insulating materials.

In addition, the first ohmic contact electrode 1480 is formed of a material including at least one chosen from Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare earth metals and alloys, metallic silicides, semiconducting silicides, CNTNs (carbonnanotube networks), transparent conducting oxide (TCO), transparent conducting nitrides, TCNs.

Figure 14:
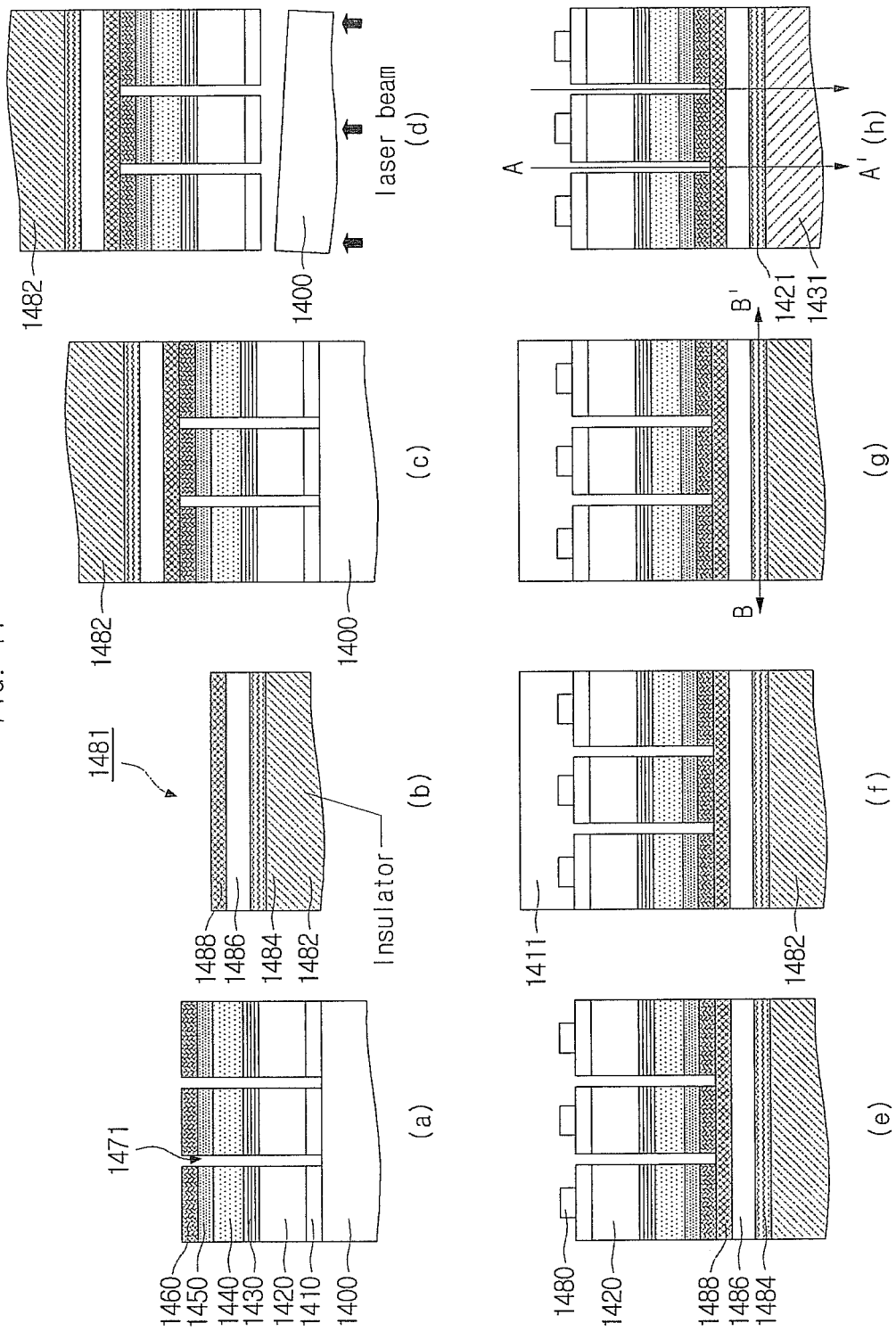
FIG. 14 is sectional views illustrating a process of manufacturing the semiconductor light-emitting device according to Preparation Example 4 of the semiconductor light-emitting device of FIG. 13.

Referring to FIGS. 14(*f*) and (*g*), the step (f) of manufacturing a final single chip is performed with two steps. First, a temporary supporting substrate (TSS) 1411 is attached in the opposite direction of the supporting substrate for preparing a semiconductor light-emitting device with an organic or inorganic bonding material. Then, the selected supporting substrate 1482 is separated and removed along the arrow direction after dissolving the sacrificial layer 1484 in a wet etching solution such as various acid, base, or salt solutions of HF, BOE, $H_2SO_4$, $HNO_3$, $H_3PO4$, KOH, NHOH, KI and the like selected according to a material used for the sacrificial layer 1484.

Referring to FIG. 14(*h*), which is the final step of completing the single chip, the unified light-emitting device chip in FIG. 13 is prepared by bonding the third supporting substrate 1431 and the heat-sink layer 1486 using the third bonding layer 1421 made of the electrically conductive soldering or brazing metal or alloy, and cutting the result vertically (A-A' arrow direction).

Preparation Example 5

Preparation of Semiconductor Light-Emitting Device

The structure of a semiconductor light-emitting device manufactured by using the supporting substrate for preparing a semiconductor light-emitting device according to Example 3 and a method for manufacturing thereof will be described in detail with reference to FIG. 15 and FIG. 16.

Figure 15:
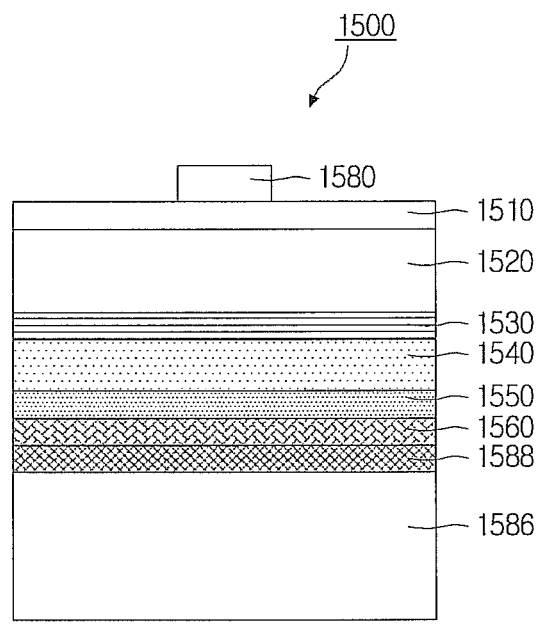
FIG. 15 is a sectional view illustrating the final single-chip-type vertical-structured semiconductor light-emitting device in Preparation Example 4 manufactured by using the supporting substrate for preparing a semiconductor light-emitting device of the present invention.

FIG. 15 is a sectional view of a semiconductor light-emitting device 1500 manufactured by using a supporting substrate for preparing a semiconductor light-emitting device according to Example 3 of the present invention. As shown in FIG. 15, the semiconductor light-emitting device 1500 is formed by laminating a first ohmic contact electrode 1580, a buffering layer 1510, an n-type semiconductor cladding layer 1520, a light-emitting active layer 1530, a p-type semiconductor cladding layer 1540, a second ohmic contact electrode 1550 and a first bonding layer 1560. A second bonding layer 1588 and a heat-sink layer 1586 are laminated on the first bonding layer 1560.

In particular, the first ohmic contact electrode 1580 can be formed on the n-type semiconductor cladding layer 1520 after the buffering layer 1510 is removed.

A selected supporting substrate 1682 of a supporting substrate for preparing a semiconductor light-emitting device 1681, used for manufacturing a semiconductor light-emitting device according to an embodiment of the invention, is formed of a single crystal, polycrystal, or amorphous substrate wafer such as sapphire ($Al_2O_3$), aluminum nitride (AlN), MgO, AlSiC, BN, BeO, $TiO_2$, $SiO_2$, glass and the like, which are electrically insulating materials, and has the difference of thermal expansion coefficient of 2 ppm or less from an initial substrate. The semiconductor light-emitting device can have the heat-sink layer 1686 having a relatively thick thickness of 80 µm to 500 µm, laminated on the selected supporting substrate 1682.

Therefore, the thick heat-sink layer 1686 of the light-emitting device according to an embodiment of the present invention can support the multi-layered light-emitting structure of the light-emitting device without having any additional third supporting substrate after the selected supporting substrate 1682, which is an electrical insulator, is removed through the sacrificial layer 1684.

A process for manufacturing a semiconductor light-emitting device having the structure described according to an embodiment of the invention will be described sequentially with reference to FIG. 16(*a*) to (*h*). However, the description that is redundant with Example 1 and Example 2 will be omitted.

Figure 16:
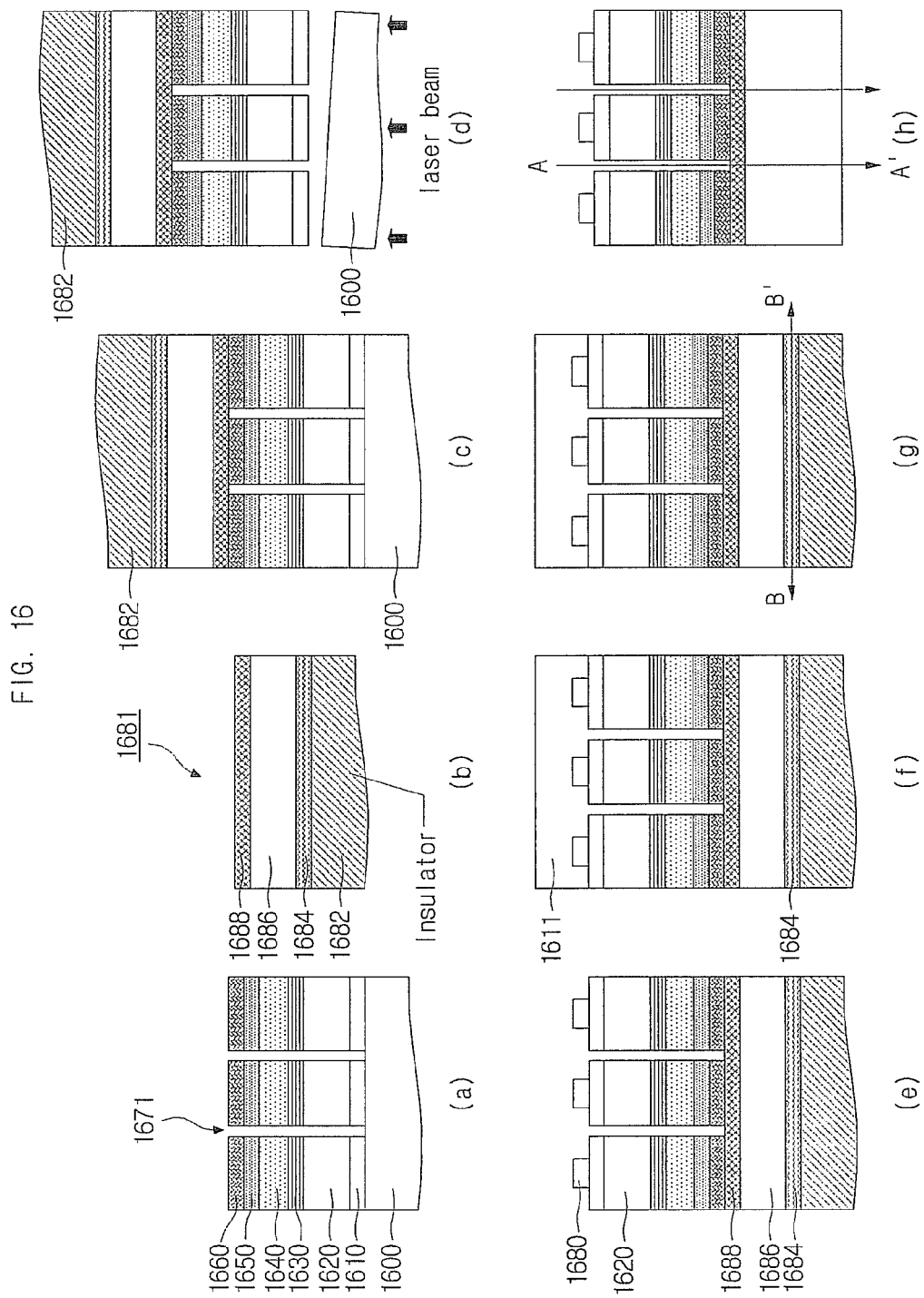
FIG. 16 is sectional views illustrating a process of manufacturing the semiconductor light-emitting device according to Preparation Example 4 of the semiconductor light-emitting device of FIG. 15.

Referring to FIG. 16(*a*), in the step (a), a semiconductor multi-layered light-emitting structure is formed on a transparent sapphire substrate which is an initial substrate 1600. The semiconductor multi-layered light-emitting structure is formed by successively laminating a low and high temperature buffering layer 1610, an n-type semiconductor cladding layer 1620, a semiconductor light-emitting active layer 1630, and a Mg-doped p-type semiconductor cladding layer 1640. The high temperature buffering layer 1610 can be a Si-doped Group III-V nitride-based semiconductor. A second high reflective ohmic contact electrode 1650 and a first bonding layer 1660 including a diffusion barrier layer are successively laminated on the p-type semiconductor cladding layer 1640 which is the uppermost part of the semiconductor multi-layered light-emitting structure thin film.

Referring to FIG. 16(*b*), in the step (b), the supporting substrate for preparing a semiconductor light-emitting device 1681 is prepared. The supporting substrate for preparing a semiconductor light-emitting device 1681 is formed by laminating a selected supporting substrate 1682 made of an electrical insulator, a sacrificial layer 1684, a heat-sink layer 1686 having a relatively thick thickness, and a second bonding layer 1688. Since the supporting substrate for preparing a semiconductor light-emitting device 1681 is the same as in Example 2, except thickness of the heat-sink layer 1686, the redundant description will be omitted.

Referring to FIG. 16(*c*), in the wafer bonding in the step (c), the first wafer and the second wafer are bonded by a thermo-compressive method. Thermo compression bonding in the step (c) can be performed at the temperature of 100° C. to 600° C. and the pressure of 1 Mpa to 200 Mpa.

Referring to FIG. 16(*d*), in the step (d), the transparent sapphire substrate, which is the initial substrate 1600, is lifted off.

Referring to FIG. 16(*e*), the step (e) is a post-processing step. The post processing can further include forming a first ohmic contact electrode 1680, which is thermally stable, on the buffering layer 1610 or the n-type semiconductor cladding layer 1620 through the first ohmic contact electrode material deposition and annealing process, and performing electrical passivation on the surface or sides of the Group III nitride-based semiconductor device by using at least one chosen from $Si_3N_4$, $SiO_2$, or various electric insulating materials.

In addition, the first ohmic contact electrode 1680 is formed of a material including at least one chosen from Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare earth metals and alloys, metallic silicides, semiconducting silicides, CNTNs (carbonnanotube networks), transparent conducting oxide (TCO), transparent conducting nitrides, and TCNs.

Referring to FIGS. 16(*f*) and (*g*), a temporary supporting substrate (TSS) 1611 is attached in the opposite direction of the supporting substrate for preparing a semiconductor light-emitting device with an organic or inorganic bonding material and then the selected supporting substrate 1682 is separated and removed along the arrow direction (B-B' direction) after dissolving the sacrificial layer 1684 in a wet etching solution such as various acid, base, or salt solutions of HF, BOE, H₂SO₄, HNO₃, H₃PO4, KOH, NHOH, KI and the like selected according to the material used for the sacrificial layer 1684.

While particular embodiments have been described, it is to be appreciated that various changes and modifications can be made by those skilled in the art without departing from the spirit and scope of the embodiment herein, as defined by the appended claims and their equivalents. It is also to be appreciated that it may be applied to various optoelectronic devices including vertically structured laser diode, transistor, etc. using a homo-epitaxial Group III-V nitride-based semiconductor substrate and a Group III-V nitride-based semiconductor multi-layered thin film manufactured by growing a Group III-V nitride-based semiconductor on a sapphire substrate. Therefore, the true scope of protection will be defined by the claims.

The invention claimed is:

1. A method for preparing a semiconductor light-emitting device, the method comprising:
    (a) preparing a first wafer in which semiconductor multi-layered light-emitting structure is disposed on an upper part of an initial substrate;
    (b) preparing a second wafer which is a supporting substrate;
    (c) bonding the second wafer on an upper part of the first wafer;
    (d) separating the initial substrate of the first wafer from a result of the bonding; and
    (e) fabricating a single-chip,
    wherein the supporting substrate is formed by successively disposing a selected supporting substrate, a sacrificial layer and a heat-sink layer,
    wherein the fabricating of the single-chip comprises:
    (e1) attaching a temporary supporting substrate in an opposite direction of the supporting substrate for preparing a semiconductor light-emitting device,
    (e2) separating the selected supporting substrate from the heat-sink layer,
    (e3) bonding a third supporting substrate to the heat-sink layer, and
    (e4) removing the temporary supporting substrate from the semiconductor multi-layered light-emitting structure.

2. The method for preparing a semiconductor light-emitting device of claim 1, wherein the semiconductor multi-layered light-emitting structure in the preparing of the first wafer comprises an n-type semiconductor cladding layer, a light-emitting active layer and a p-type semiconductor cladding layer.

3. The method for preparing a semiconductor light-emitting device of claim 1, further comprising (f) performing passivation after forming a first electrode on the upper part of the first wafer from which the initial substrate is separated, before the fabricating of the single-chip.

4. The method for preparing a semiconductor light-emitting device of claim 3, wherein a material for forming the first electrode in the performing of the passivation is composed of a material comprising at least one selected from the group consisting of Al, Ti, Cr, Ta, Ag, Al, Rh, Pt, Au, Cu, Ni, Pd, In, La, Sn, Si, Ge, Zn, Mg, NiCr, PdCr, CrPt, NiTi, TiN, CrN, SiC, SiCN, InN, AlGaN, InGaN, rare earth metals and alloys, metallic silicides, semiconducting silicides, CNTNs (carbon-nanotube networks), transparent conducting oxides (TCO) and transparent conducting nitrides (TCN).

5. The method for preparing a semiconductor light-emitting device of claim 3, wherein the first electrode in the forming of the passivation is formed on an upper surface of a buffering layer or an n-type semiconductor cladding layer.

6. The method for preparing a semiconductor light-emitting device of claim 1, wherein the bonding of the second wafer is performed by a thermo compression bonding method at a temperature of 100° C. to 600° C. and a pressure of 1 Mpa to 200 Mpa.

7. The method for preparing a semiconductor light-emitting device of claim 1, wherein the separating of the initial substrate of the first wafer from the bonded result in the bonding of the second wafer is performed by a method selected from the group consisting of a laser lift-off method irradiating a laser beam to a surface of the initial substrate, a chemo-mechanical polishing method, and a wet etching method using a wet etching solution.

8. The method for preparing a semiconductor light-emitting device of claim 1, wherein the preparing of the semiconductor light-emitting device in the single-chip in the fabricating of the single-chip further comprises:
    (e5) dividing the second wafer into the single-chip unit.

9. The method for preparing a semiconductor light-emitting device of claim 8, wherein the thickness of the heat-sink layer of the supporting substrate device is 80 µm to 500 µm.

10. The method for preparing a semiconductor light-emitting device of claim 1, wherein the selected supporting substrate is separated by dissociation of the sacrificial layer with a laser lift-off method or a wet etching method.

11. The method for preparing a semiconductor light-emitting device of claim 1, wherein the first wafer in the preparing of the first wafer is prepared by forming at least an optical reflective layer, an electrical insulating layer, a diffusion barrier layer, or a bonding layer on the upper part of the semiconductor multi-layered light-emitting structure disposed on the upper part of the initial substrate.

12. The method for preparing a semiconductor light-emitting device of claim 11, wherein the electrical insulating layer, the diffusion barrier layer, or the bonding layer on the upper part of the semiconductor multi-layered light-emitting structure is formed by physical vapor deposition, chemical vapor deposition, electro plating or electroless plating.

13. The method for preparing a semiconductor light-emitting device of claim 1, wherein the sacrificial layer disposed on the selected supporting substrate of the second wafer is composed of a material soluble in a wet etching solution, and the sacrificial layer of the supporting substrate for preparing a semiconductor light-emitting device in the forming of the passivation is wet-etched by dissolving the sacrificial layer into a wet etching solution to separate and remove the selected supporting substrate and then the single chip is obtained by severing a result of the separating and removing.

14. The method for preparing a semiconductor light-emitting device of claim 1, wherein the selected supporting substrate has a difference of thermal expansion coefficient of 2 ppm or less from the initial substrate.

15. A method for preparing a semiconductor light-emitting device, the method comprising:
    preparing a first wafer comprising a substrate and a light-emitting structure on the substrate, the light-emitting structure including a first conductive type semiconductor layer, a second conductive type semiconductor layer, and an active layer between the first conductive type semiconductor layer and the second conductive type semiconductor layer;
    preparing a second wafer, the second wafer is formed by successively forming a selected supporting substrate, a sacrificial layer, a heat-sink layer;
    bonding the second wafer on the light-emitting structure of the first wafer;

separating the substrate from the light-emitting structure;
attaching a temporary supporting substrate in the opposite direction of the second wafer;
separating the selected supporting substrate of the second wafer;
bonding a third supporting substrate to the heat-sink layer; and
removing the temporary supporting substrate,
wherein the selected supporting substrate has a difference of thermal expansion coefficient of 2 ppm or less from the substrate.

16. The method for preparing a semiconductor light-emitting device of claim 15, further comprising:
dividing the second wafer into a single-chip unit.

17. The method for preparing a semiconductor light-emitting device of claim 16, wherein the heat-sink layer is 80 µm to 500 µm.

18. The method for preparing a semiconductor light-emitting device of claim 15, wherein the heat-sink layer is 0.1 µm to 80 µm.

19. A method for preparing a semiconductor light-emitting device, the method comprising:
preparing a first wafer comprising a substrate and a light-emitting structure on the substrate, the light-emitting structure comprises a first conductive type semiconductor layer, an active layer and a second conductive type semiconductor layer,
preparing a second wafer, the second wafer is formed by forming a selected supporting substrate, a sacrificial layer, a heat-sink layer and a bonding layer;
bonding the bonding layer of the second wafer on the second conductive type semiconductor layer of the light-emitting structure of the first wafer;
separating the substrate of the first wafer from the result of the bonding, wherein a side of the first wafer is exposed;
forming a first electrode on the exposed side surface of the first wafer; and
fabricating a single-chip by severing the result of the forming,
wherein the selected supporting substrate has a difference of thermal expansion coefficient of 2 ppm or less from the substrate,
wherein the fabricating the single-chip comprises:
attaching a temporary supporting substrate in the opposite direction of the second wafer,
separating selected supporting substrate from the heat-sink layer of the second wafer,
bonding a third supporting substrate to the heat-sink layer, and
removing the temporary supporting substrate.

* * * * *